(12) United States Patent
Nagaseki et al.

(10) Patent No.: US 9,390,943 B2
(45) Date of Patent: Jul. 12, 2016

(54) SUBSTRATE PROCESSING APPARATUS

(71) Applicant: TOKYO ELECTRON LIMITED, Tokyo (JP)

(72) Inventors: Kazuya Nagaseki, Miyagi (JP); Etsuji Ito, Miyagi (JP); Akihiro Yokota, Miyagi (JP); Shinji Himori, Miyagi (JP); Shoichiro Matsuyama, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 13/767,195

(22) Filed: Feb. 14, 2013

(65) Prior Publication Data

US 2013/0220547 A1 Aug. 29, 2013

Related U.S. Application Data

(60) Provisional application No. 61/606,065, filed on Mar. 2, 2012.

(30) Foreign Application Priority Data

Feb. 14, 2012 (JP) .................................. 2012-029860

(51) Int. Cl.
*C23C 14/35* (2006.01)
*H01J 37/32* (2006.01)
(Continued)

(52) U.S. Cl.
CPC ............ *H01L 21/465* (2013.01); *C23C 14/352* (2013.01); *H01J 37/3266* (2013.01);
(Continued)

(58) Field of Classification Search
CPC ....................... H01J 37/3266–37/32688; H01J 37/3402–37/3408; H01J 37/345–37/3458; H01J 37/32082–37/32165; H01J 37/3461; C23C 14/35–14/352; H05H 2001/4607–2001/4637; H05H 2001/4645–2001/4682; H05H 2001/469–2001/4697; H05H 1/46; H01L 21/32136; H01L 21/465
See application file for complete search history.

(56) References Cited

U.S. PATENT DOCUMENTS 3,824,017 A * 7/1974 Galyon ................. G01N 21/211
356/504
3,874,797 A * 4/1975 Kasai .................... G01N 21/211
356/369
(Continued)

FOREIGN PATENT DOCUMENTS

CN 101853764 A 10/2010
JP 4-80385 A 3/1992
(Continued)

OTHER PUBLICATIONS

International Search Report mailed Apr. 16, 2013 in PCT/JP2013/051362 (with an English translation) (8 pages).

*Primary Examiner* — Parviz Hassanzadeh
*Assistant Examiner* — Stanislav Antolin
(74) *Attorney, Agent, or Firm* — Rothwell, Figg, Ernst & Manbeck, P.C.

(57) ABSTRACT

A substrate processing apparatus generates an electric field in a processing space between a lower electrode to which a high frequency power is supplied and an upper electrode facing the lower electrode and performs plasma processing on a substrate mounted on the lower electrode by using a plasma generated by the electric field. Distribution of a plasma density in the processing space is controlled by a magnetic field generated by controlling a plurality of electromagnets provided at a top surface of the upper electrode which is provided to be opposite to the processing space.

10 Claims, 28 Drawing Sheets

(51) Int. Cl.
*H01J 37/34* (2006.01)
*H01L 21/3213* (2006.01)
*H01L 21/465* (2006.01)

(52) U.S. Cl.
CPC ..... *H01J37/32091* (2013.01); *H01J 37/32669* (2013.01); *H01J 37/32688* (2013.01); *C23C 14/35* (2013.01); *C23C 14/351* (2013.01); *H01J 37/345* (2013.01); *H01J 37/3452* (2013.01); *H01L 21/32136* (2013.01)

(56) References Cited

U.S. PATENT DOCUMENTS

| | | | | |
|---|---|---|---|---|
| 4,627,904 A * | 12/1986 | Mintz | | 204/298.06 |
| 4,727,293 A * | 2/1988 | Asmussen | | H01J 27/16 118/723 MA |
| 4,842,683 A * | 6/1989 | Cheng | | H01J 37/32431 156/345.37 |
| 4,842,703 A * | 6/1989 | Class et al. | | 204/192.12 |
| 4,957,605 A * | 9/1990 | Hurwitt et al. | | 204/192.12 |
| 5,082,542 A * | 1/1992 | Moslehi | | H01J 37/3266 118/723 E |
| 5,198,725 A * | 3/1993 | Chen | | H01J 37/32678 204/298.16 |
| 5,215,619 A * | 6/1993 | Cheng | | H01J 37/32477 118/724 |
| 5,272,417 A * | 12/1993 | Ohmi | | H01J 37/32082 156/345.47 |
| 5,589,039 A * | 12/1996 | Hsu | | 204/192.12 |
| 5,618,758 A * | 4/1997 | Tomita | | C23C 16/515 438/485 |
| 5,733,405 A * | 3/1998 | Taki | | H01J 37/3266 118/723 E |
| 5,767,628 A * | 6/1998 | Keller et al. | | 315/111.51 |
| 5,859,501 A * | 1/1999 | Chi | | 315/111.21 |
| 5,961,773 A * | 10/1999 | Ichimura | | H01J 37/32082 118/723 MA |
| 5,963,329 A * | 10/1999 | Conrad | | G01B 11/02 356/601 |
| 6,000,360 A * | 12/1999 | Koshimizu | | 118/723 E |
| 6,009,828 A * | 1/2000 | Tomita | | C23C 16/515 118/723 E |
| 6,015,476 A * | 1/2000 | Schlueter et al. | | 118/723 E |
| 6,022,446 A * | 2/2000 | Shan et al. | | 156/345.46 |
| 6,165,567 A * | 12/2000 | Ventzek et al. | | 427/576 |
| 6,197,165 B1 * | 3/2001 | Drewery et al. | | 204/192.12 |
| 6,216,632 B1 * | 4/2001 | Wickramanayaka | | C23C 16/509 118/723 E |
| 6,297,880 B1 * | 10/2001 | Rosencwaig | | G01B 11/0641 356/364 |
| 6,462,482 B1 * | 10/2002 | Wickramanayaka et al. | | 118/723 E |
| 6,462,817 B1 * | 10/2002 | Strocchia-Rivera | | G01N 21/95607 257/E21.528 |
| 6,562,190 B1 * | 5/2003 | Kuthi | | H01J 37/32146 156/345.44 |
| 6,700,090 B2 * | 3/2004 | Ono | | H01J 37/32082 219/121.42 |
| 6,829,056 B1 * | 12/2004 | Barnes | | H01J 37/32935 118/708 |
| 6,853,141 B2 * | 2/2005 | Hoffman | | H01J 37/32091 315/111.21 |
| 6,888,094 B2 * | 5/2005 | Ono | | H01J 37/32082 219/121.36 |
| 7,179,754 B2 * | 2/2007 | Kraus | | H01L 21/28202 257/296 |
| 7,514,373 B2 * | 4/2009 | Kraus | | H01L 21/28202 257/E21.143 |
| 7,611,993 B2 * | 11/2009 | Ono | | H01J 37/32082 156/345.44 |
| 8,703,002 B2 * | 4/2014 | Matsudo | | H01J 37/32091 216/67 |
| 2001/0054383 A1 * | 12/2001 | Pu et al. | | 118/723 I |
| 2002/0048019 A1 * | 4/2002 | Sui | | G01N 21/21 356/369 |
| 2003/0006008 A1 * | 1/2003 | Horioka et al. | | 156/345.46 |
| 2003/0024478 A1 * | 2/2003 | Egami | | H01J 37/32623 118/723 MA |
| 2003/0183509 A1 * | 10/2003 | Braeckelmann | | 204/192.17 |
| 2003/0201256 A1 * | 10/2003 | Tauchi | | H01J 37/32082 219/121.42 |
| 2003/0207583 A1 * | 11/2003 | Kuthi | | H01J 37/32146 438/714 |
| 2003/0226641 A1 * | 12/2003 | Collins et al. | | 156/345.49 |
| 2004/0094509 A1 * | 5/2004 | Miyata et al. | | 156/345.46 |
| 2004/0159639 A1 * | 8/2004 | Ono | | H01J 37/32082 219/121.42 |
| 2004/0195216 A1 * | 10/2004 | Strang | | 219/121.43 |
| 2004/0242021 A1 * | 12/2004 | Kraus | | H01L 21/28202 438/776 |
| 2005/0183822 A1 * | 8/2005 | Ono | | H01J 37/32082 156/345.28 |
| 2005/0224337 A1 * | 10/2005 | Iwasaki et al. | | 204/192.32 |
| 2005/0241762 A1 * | 11/2005 | Paterson | | H01J 37/32082 156/345.28 |
| 2005/0263390 A1 * | 12/2005 | Gung et al. | | 204/192.17 |
| 2007/0051617 A1 * | 3/2007 | White | | H01J 37/3455 204/192.1 |
| 2007/0184562 A1 * | 8/2007 | Ono | | H01J 37/32082 438/5 |
| 2007/0235426 A1 | 10/2007 | Matsumoto et al. | | |
| 2008/0023443 A1 * | 1/2008 | Paterson | | H01J 37/32082 216/67 |
| 2008/0113149 A1 * | 5/2008 | Egami et al. | | 428/98 |
| 2008/0230008 A1 * | 9/2008 | Paterson | | H01J 37/32091 118/723 E |
| 2008/0257261 A1 * | 10/2008 | Hanawa | | H01J 37/32623 118/719 |
| 2008/0260966 A1 * | 10/2008 | Hanawa | | H01J 37/32623 427/569 |
| 2008/0311758 A1 * | 12/2008 | Bailey et al. | | 156/345.3 |
| 2009/0047795 A1 * | 2/2009 | Matsudo | | H01J 37/32091 438/729 |
| 2010/0140221 A1 * | 6/2010 | Kikuchi | | H01J 37/32091 216/67 |
| 2010/0294656 A1 * | 11/2010 | Ikeda | | H01J 37/32091 204/298.11 |
| 2012/0037493 A1 * | 2/2012 | Tanifuji | | C23C 14/54 204/192.38 |
| 2013/0122714 A1 * | 5/2013 | Matsudo | | H01J 37/32091 438/725 |
| 2014/0020709 A1 * | 1/2014 | Kikuchi | | H01J 37/32091 134/1.1 |
| 2014/0206199 A1 * | 7/2014 | Himori | | H01L 21/31116 438/717 |
| 2014/0346040 A1 * | 11/2014 | Yokota et al. | | 204/298.37 |
| 2015/0072534 A1 * | 3/2015 | Himori | | H01L 21/31116 438/725 |

FOREIGN PATENT DOCUMENTS

| | | | | |
|---|---|---|---|---|
| JP | 8-288096 A | 11/1996 | | |
| JP | 9-139380 A | 5/1997 | | |
| JP | 10-152775 A | 6/1998 | | |
| JP | 3037848 B2 | 5/2000 | | |
| JP | 2000200696 A * | 7/2000 | | H05H 1/24 |
| JP | 3375302 B2 | 2/2003 | | |
| JP | 2007-266533 A | 10/2007 | | |
| JP | 4107518 B2 | 6/2008 | | |
| JP | 2009-71292 A | 4/2009 | | |

\* cited by examiner

FIG. 6A
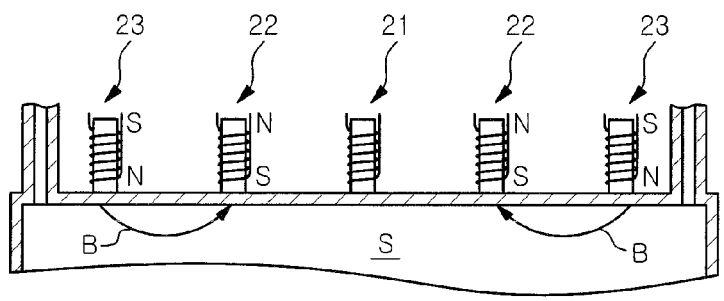
FIG. 6B
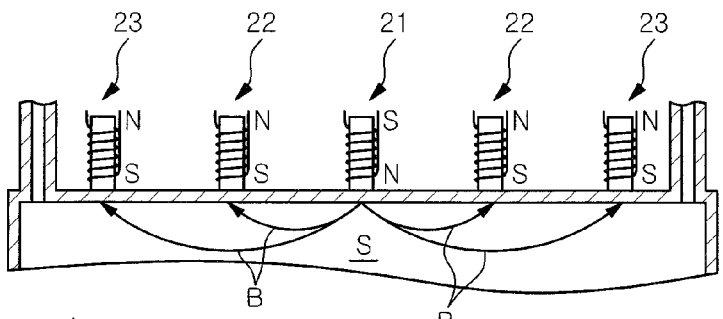
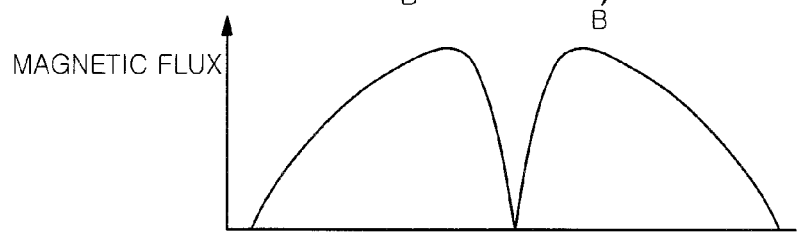

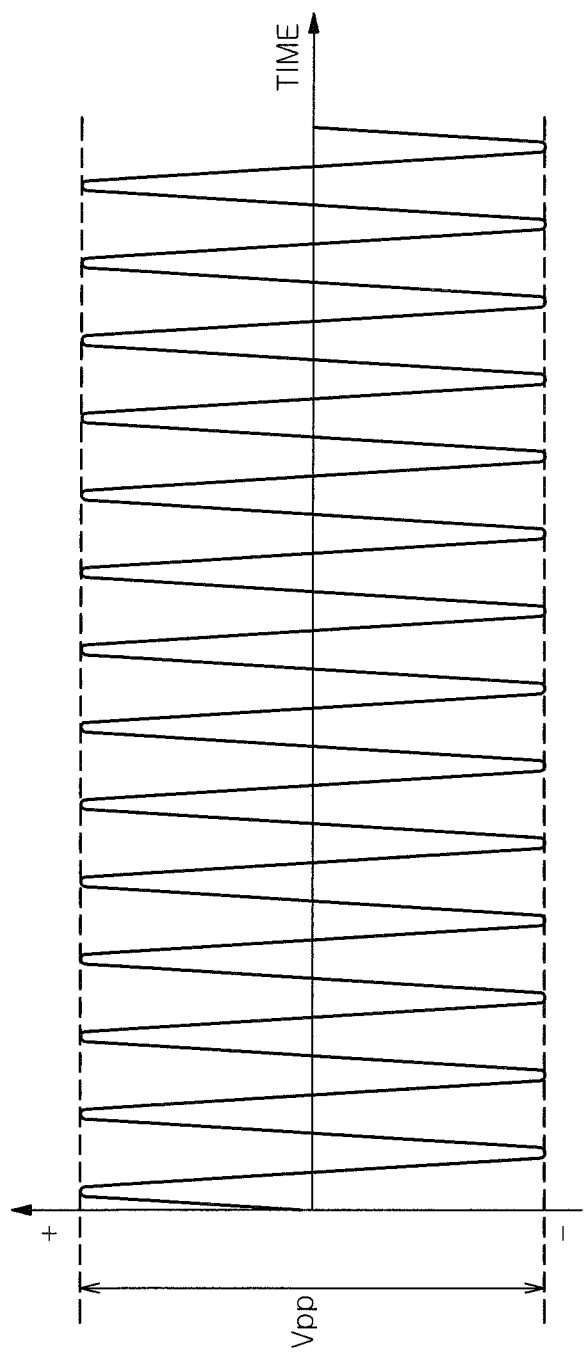

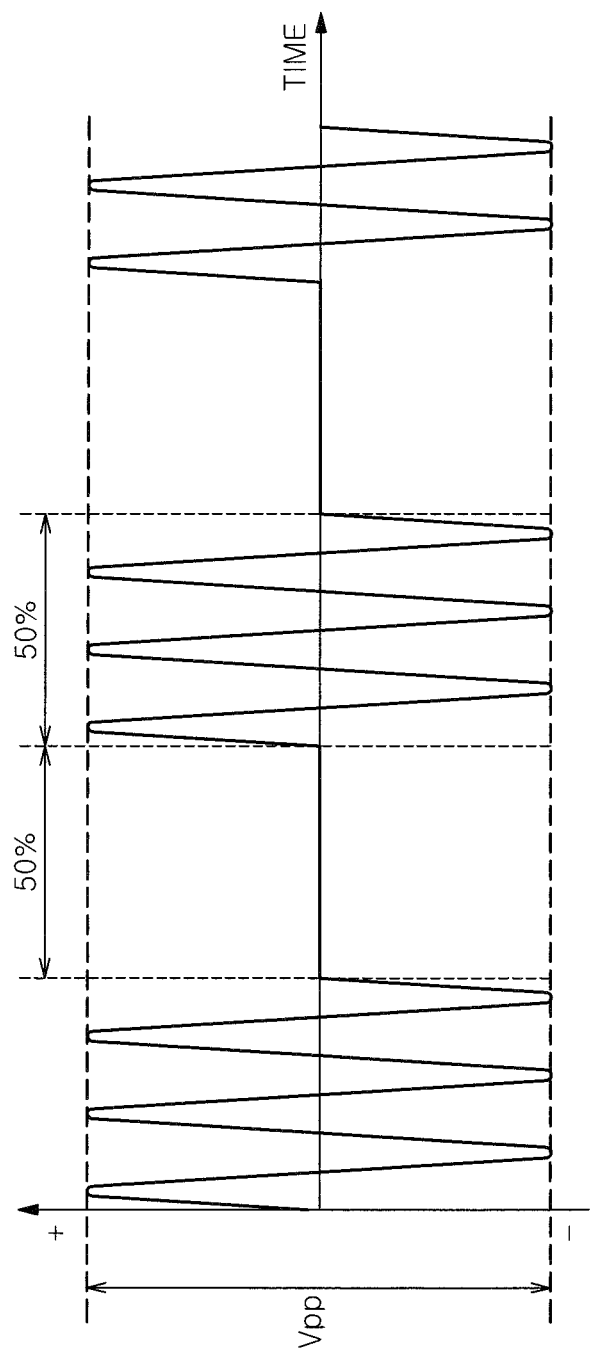

SUBSTRATE PROCESSING APPARATUS

CROSS-REFERENCE

This application claims priority to U.S. Provisional Application 61/606,065, filed Mar. 2, 2012, and further claims priority to Japanese Application Number 2012-029860, filed Feb. 14, 2012, the entire contents of each of which are hereby incorporated by reference.

FIELD OF THE INVENTION

The present invention relates to a substrate processing apparatus for controlling distribution of a plasma density by using a magnetic field.

BACKGROUND OF THE INVENTION

Conventionally, a plasma processing apparatus shown in FIG. 15 is used for performing plasma processing on a substrate, e.g., a semiconductor wafer (hereinafter, referred to as "wafer") W. In this substrate processing apparatus 120, a processing gas is introduced into a processing space S within a chamber 121 and, at the same time, a high frequency power is supplied from high frequency power supplies 122 and 123 to a lower electrode 124. In the processing space S, an electric field is generated by the high frequency power supplied to the lower electrode 124. Molecules or atoms of the processing gas are excited by the electric field, thereby generating a plasma. At this time, the wafer W mounted on the lower electrode 124 is subjected to plasma processing by radicals or positive ions in the plasma.

However, as disclosed in Patent Document 1, when a high-density plasma is generated by supplying a high frequency power to the lower electrode 124 and the frequency of the high frequency power is set to be high, a high frequency current generated by the high frequency power tends to be focused near the center of the lower electrode 124. As a result, the density of the plasma generated in the processing space S becomes higher at a region facing the center of the wafer W (hereinafter, referred to as "central region") than at a region facing the periphery circumference of the wafer (hereinafter, referred to as "peripheral region").

FIG. 16 shows distribution of an electron density Ne in the region facing the wafer with respect to the frequencies of the high frequency power supplied to the lower electrode. Here, the distribution has been normalized based on the electron density of the central region.

In general, when a plasma of a processing gas is generated, electrons as well as positive ions and radicals are generated. Therefore, the distribution of the electron density substantially coincides with that of the plasma density. Further, as shown in FIG. 16, as the frequency of the supplied high frequency power is increased from about 27 MHz to 150 MHz, the electron density near the center of the wafer W becomes higher than the electron density of the peripheral region of the wafer W. Particularly, when the frequency of the supplied high frequency power is higher than about 60 MHz, the profile of the distribution of the electron density becomes distinctly curved upward with a vertex peaked at the vicinity of the center of the wafer W.

When the plasma is generated in the processing space S, a negative bias potential Vdc is generated on the surface of the wafer W mounted on the lower electrode 124. Further, the Vdc is determined by the amount of electrons reaching the lower electrode 124. Hence, the amount of electrons reaching the vicinity of center of the wafer W where the electron density is focused is increased, whereas the Vdc is decreased. In other words, the distribution of the electron density and the distribution of Vdc are inversely correlated with each other.

When the distribution of Vdc is not uniform, the current flows on the surface of the wafer W. At this time, as shown in FIG. 3 to be later described, when the charge amount of the current passing through a gate oxide film 153$b$ of a semiconductor device formed on the surface of the wafer W exceeds a predetermined threshold value, the gate oxide film 153$b$ is damaged or destroyed. The gate oxide film 153$b$ is also damaged or destroyed if the amount of charges that are accumulated on the gate electrode 152 when the current flows exceeds a predetermined threshold value.

Therefore, in order to avoid the destruction of the gate oxide film 153$b$, the present inventors have suggested a plasma processing method for supplying a high frequency power to the lower electrode 124 in a pulse form and alternately repeating a plasma generation state and a plasma non-generation state in which a plasma is not generated in the processing space S at predetermined intervals (see e.g., Patent Document 2). In this plasma processing method, the continuous plasma generation time is set to be short enough that the amount of charges accumulated on the gate electrode 152 by the current does not exceed a threshold value and, then, a plasma non-generation state is followed.

Since the plasma generation state and the plasma non-generation state are alternately repeated at predetermined intervals, even if the surplus amount of charges are accumulated on the gate electrode 152 in any location on the wafer W during the plasma generation state, the surplus charges accumulated are spread out to be distributed throughout to a periphery thereof during the plasma non-generation state, thereby solving the problem of charge accumulation on the gate electrode 152. Accordingly, it is possible to prevent the increase of accumulated charges on the gate electrode 152, and also possible to prevent damages to the gate oxide film 153$b$.

PATENT DOCUMENTS

Patent Document 1: Japanese Patent Application Publication No. 2007-266533
Patent Document 2: Japanese Patent Application Publication No. 2009-71292

However, further increase in the level of the high frequency power supplied to the lower electrode 124 is being examined to improve an etching rate and thereby to obtain a higher throughput. In this case, the distribution of Vdc becomes more non-uniform and, thus, makes a higher current flow on the surface of the wafer W. In the plasma processing method for repeating the plasma generation state and the plasma non-generation state, if the amount of charges of the current passing through the gate oxide film 153$b$ is further increased, the effect of distributing the accumulated charges throughout to the periphery achieved during the plasma non-generation state becomes not sufficient. By increasing the duration of the plasma non-distribution state (by reducing a duty ratio), the accumulated charges can be spread out to be distributed throughout to the periphery. Since, however, the plasma generation state becomes relatively short, the etching rate cannot be improved.

SUMMARY OF THE INVENTION

In view of the above, the present invention provides a substrate processing apparatus capable of reliably suppressing dielectric breakdown of a gate oxide film by preventing accumulation of charges on a gate electrode.

In accordance with a first aspect of the present invention, there is provided a substrate processing apparatus configured to generate an electric field in a processing space between a lower electrode, to which a high frequency power is supplied, and an upper electrode facing the lower electrode and perform plasma processing on a substrate mounted on the lower electrode by using a plasma generated by the electric field. Distribution of a plasma density in the processing space is controlled by a magnetic field generated by controlling a plurality of electromagnets provided at a top surface of the upper electrode which is provided to be opposite to the processing space.

When the distribution of the plasma density is controlled, an intensity of the magnetic field in a region, where the plasma density is low, may be controlled to become great.

A frequency of the high frequency power supplied to the lower electrode is preferably about 60 MHz or above.

When the distribution of the plasma density is controlled, an intensity of the magnetic field in a region facing a center of the substrate in the processing space may be controlled to become small and an intensity of the magnetic field in a region facing a periphery of the substrate may be controlled to become great.

The plurality of electromagnets may be divided into a plurality of electromagnet groups, and intensities of magnetic fields generated by the electromagnets and/or magnetic poles of the electromagnets may be controlled on an electromagnet group basis.

In each of the electromagnet groups, magnetic poles of the electromagnets which face the processing space may have the same polarity.

When the distribution of the plasma density is controlled, a first period in which the high frequency power supplied to the lower electrode may be controlled such that a plasma is generated by the electric field and a second period in which the high frequency power supplied to the lower electrode is controlled such that a plasma is not generated by the electric field are repeated.

BRIEF DESCRIPTION OF THE DRAWINGS

The above and other objects and features of the present invention will become apparent from the following description of embodiments, given in conjunction with the accompanying drawings, in which:

FIGS. 1A and 1B schematically show a configuration of a substrate processing apparatus in accordance with a first embodiment of the present invention, wherein FIG. 1A is a cross sectional view of the substrate processing apparatus, and FIG. 1B shows an upper electrode of the substrate processing apparatus viewed from below along an arrow in FIG. 1A;

FIGS. 4A and 4B show distributions of the broken gate oxide films in the surface of the wafer which are obtained when Vdcs of respective portions are different, wherein FIG. 4A shows a high output state and FIG. 4B shows a low output state;

FIGS. 5A and 5B explain drift movement of electrons caused by a magnetic field and an electric field generated in the substrate processing apparatus of FIG. 1, wherein FIG. 5A is a cross sectional view of the substrate processing apparatus of FIG. 1, and FIG. 5B shows an upper electrode of the substrate processing apparatus viewed along an arrow in FIG. 5A;

FIG. 6A to FIG. 6C explain a relationship between magnetic poles of electromagnets which face the processing space and an intensity of a magnetic field generated in a processing space;

FIGS. 7A to 7C explain a plasma processing method performed by the substrate processing apparatus of the present embodiment, wherein FIG. 7A shows Ne distribution in a plasma generated by an electric field; FIG. 7B shows Ne distribution in a plasma generated by a magnetic field; and FIG. 7C shows Ne distribution which is obtained after the Ne distribution in the plasma generated by the electric field and the Ne distribution in the plasma generated by the magnetic field are superposed;

FIGS. 8A and 8B schematically show a configuration of another substrate processing apparatus of the present embodiment, wherein FIG. 8A is a cross sectional view of the substrate processing apparatus, and FIG. 8B shows an upper electrode of the substrate processing apparatus viewed along an arrow in FIG. 8A;

FIGS. 9A and 9B show a waveform of a high frequency power supplied to a susceptor in a plasma processing method performed by a substrate processing apparatus in accordance with a second embodiment of the present invention, wherein FIG. 9A is a waveform of the high frequency power in case of supplying the high frequency power not in a pulse form, and FIG. 9B shows a waveform of the high frequency power in case of supplying the high frequency power in a pulse form;

FIGS. 11A to 11F show a yield of a gate oxide film in the first test wafer after dry etching at a low output, wherein FIG. 11A shows a comparative example 1; FIG. 11B shows a test example 1; FIG. 11C shows a test example 2; FIG. 11D shows a comparative example 2; FIG. 11E shows a test example 3; and FIG. 11F shows a test example 4;

FIGS. 12A to 12C show etching rates of a photoresist in a second test wafer, wherein FIG. 12A shows a case of performing dry etching under the same conditions as those of the comparative example 1, FIG. 12B shows a case of performing dry etching under the same conditions as those of the test example 1, and FIG. 12C shows a case of performing dry etching under the same conditions as those of the test example 2;

FIGS. 13A to 13F show a yield of a gate oxide film after dry etching of a high output, wherein FIG. 13A shows a comparative example 3, FIG. 13B shows a test example 5, FIG. 13C shows a test example 6, FIG. 13D shows a comparative example 4, FIG. 13E shows a test example 7, and FIG. 13F shows a test example 8;

FIGS. 14A to 14C show etching rates of a photoresist in the second test wafer, wherein FIG. 14A shows a case of performing dry etching under the same conditions as those of the comparative example 3, FIG. 14B shows a case of performing dry etching under the same conditions as those of the test example 5 and FIG. 14C shows a case of performing dry etching under the same conditions as those of the test example 6;

DETAILED DESCRIPTION OF THE EMBODIMENTS

Hereinafter, embodiments of the present invention will be described with reference to the accompanying drawings.

First, a substrate processing apparatus in accordance with a first embodiment of the present invention will be described.

Figure 1A:
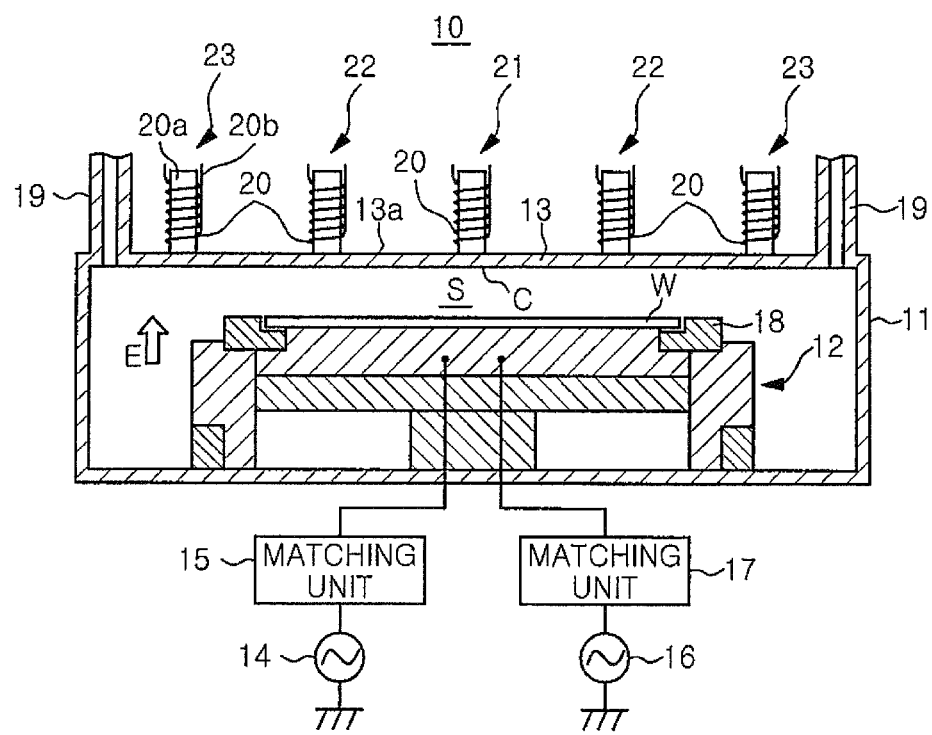
Figure 1B:
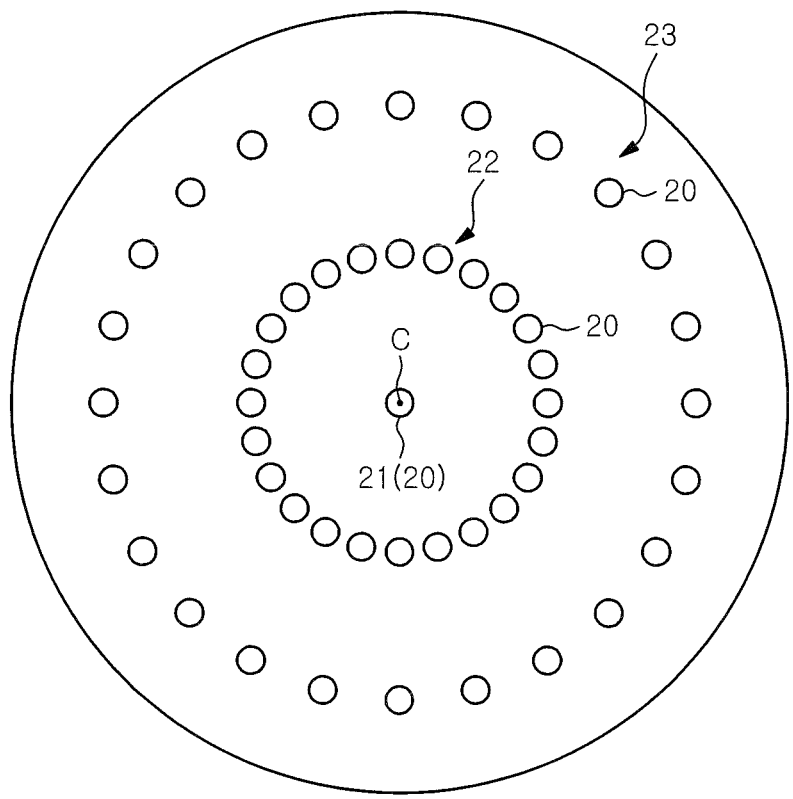

FIGS. 1A and 1B schematically show a configuration of a substrate processing apparatus in accordance with the present embodiment. FIG. 1A is a cross sectional view of the substrate processing apparatus and FIG. 1B shows an upper electrode of the substrate processing apparatus viewed from below in the direction of the arrow shown in FIG. 1A. The substrate processing apparatus performs plasma processing, e.g., dry etching, on a wafer for a semiconductor device (hereinafter, simply referred to as "wafer") W as a substrate. The wafer W subjected to the plasma processing in the present embodiment has a structure shown in FIG. 3. An oxide film ($SiO_2$ film) 153 is formed on a silicon base layer 150, and a plurality of gate electrodes 152 is formed on the oxide film 153. The oxide film 153 includes a device isolation region 153a for ensuring insulation between the gate electrodes 152, and a gate oxide film 153b between the gate electrodes 152 and the silicon base layer 150.

Referring to FIG. 1A, the substrate processing apparatus 10 includes a cylindrical chamber 11 for accommodating therein a wafer W having a diameter of, e.g., about 300 mm. A cylindrical susceptor 12 (lower electrode) for mounting thereon a wafer W is provided at a lower portion of the chamber 11, and a ceiling portion of the chamber 11 which faces the susceptor 12 forms an upper electrode 13. A processing space S is provided between the susceptor 12 and the upper electrode 13.

In the substrate processing apparatus 10, a plasma is generated in the processing space S depressurized by an exhaust unit (not shown), and the plasma processing is performed on the wafer W mounted on the susceptor 12 by the plasma thus generated.

A first high frequency power supply 14 is connected to the susceptor 12 in the chamber 11 via a first matching unit 15, and a second high frequency power supply 16 is connected to the susceptor 12 via a second matching unit 17. The first high frequency power supply 14 supplies a high frequency power having a high frequency of, e.g., about 100 MHz, to the susceptor 12. The second high frequency power supply 16 supplies a high frequency power having a low frequency of, e.g., about 3.2 MHz, to the susceptor 12. Accordingly, the susceptor 12 serves as the lower electrode. Further, each of the first matching unit 15 and the second matching unit 17 controls an impedance, thereby maximizing the efficiency of supplying the high frequency powers to the susceptor 12.

A stepped portion is formed at vicinity of the upper peripheral portion of the susceptor 12 such that the central portion of the susceptor 12 protrudes upward in the drawing. An electrostatic chuck (not shown) made of ceramic and having therein an electrode chuck plate is disposed at an upper end of the central portion of the susceptor 12. The wafer W is adsorptively held on the electrostatic chuck by Coulomb force or Johnsen-Rahbek force.

A focus ring 18 is installed at the stepped portion formed at the vicinity of the upper periphery of the susceptor 12 so as to surround the wafer W adsorptively held on the electrostatic chuck. The focus ring 18 is made of Si or SiC, and the distribution region of the plasma in the processing space S can be extended to above the focus ring as well as above the wafer W. A processing gas inlet line 19 is connected to the ceiling portion of the chamber 11 which faces the susceptor 12 with the processing space S therebetween, and the processing gas inlet line 19 introduces a processing gas into the processing space S.

In the substrate processing apparatus 10, the processing gas is introduced through the processing gas inlet line 19 into the processing space S, and an electric field E directed in the direction of arrow in the drawing, i.e., from the susceptor 12 toward the upper electrode 13, is generated in the processing space S by the high frequency powers supplied from the first and the second high frequency power supplies 14 and 16 to the susceptor 12. Molecules or atoms of the introduced processing gas are excited by the electric field E, thereby generating a plasma. At this time, radicals in the plasma float toward the wafer W. Further, positive ions in the plasma are attracted toward the wafer W by the negative bias potential Vdc generated on the surface of the wafer W, so that plasma processing is performed on the wafer W.

The present inventors have examined the distribution of the gate oxide film destroyed by the current due to the non-uniformity of Vdc on the surface of the wafer W in the case of performing plasma processing on the wafer W in the substrate processing apparatus 10. As a result, the distribution states of the destroyed gate oxide film have observed to be different when the level of the high frequency power supplied to the susceptor 12 was high, (hereinafter, referred to as "high output state") and when the level of the high frequency power supplied to the susceptor 12 was relatively low (hereinafter, referred to as "low output state"), as shown in FIG. 4 to be later described.

The present inventors have analyzed the distributions of Vdc on the surface of the wafer W in the high output state and the low output state and have deduced that the distribution states of the destroyed gate oxide film are different due to the mechanism to described below.

Figure 2:
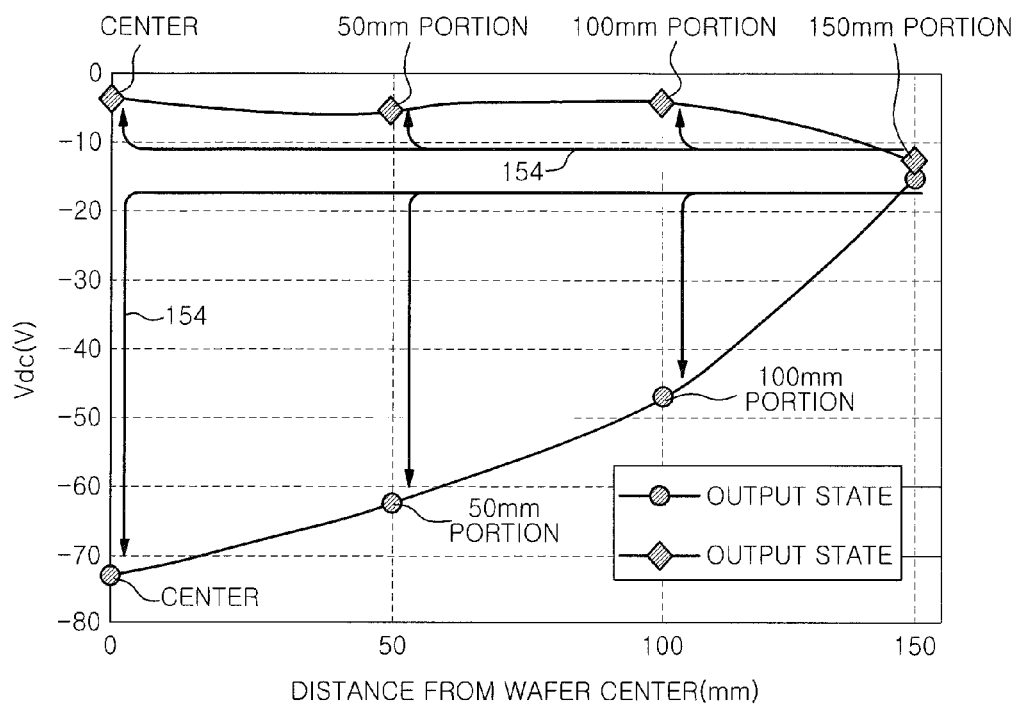
FIG. 2 is a graph showing distribution of Vdc on a surface of a wafer.

FIG. 2 is a graph showing the distribution of Vdc on the surface of the wafer. In FIG. 2, the high output state is indicated by [○], and the low output state is indicated by [◇].

Figure 16:
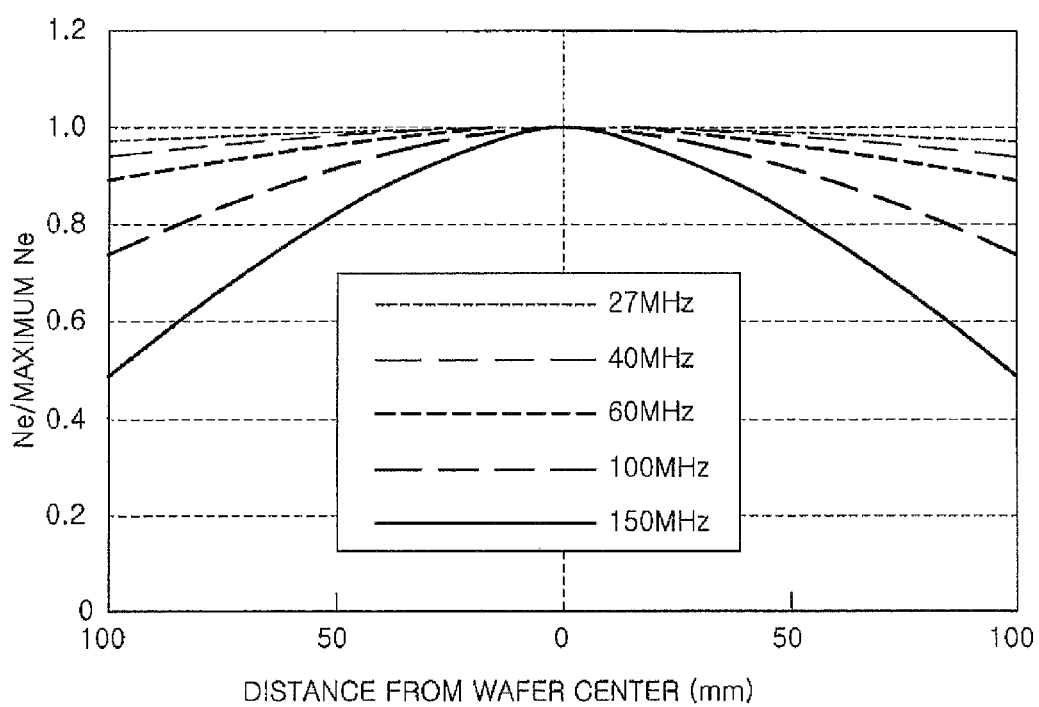
FIG. 16 is a graph showing distribution of an electron density Ne in a region facing a wafer with respect to frequencies of a high frequency power supplied to a lower electrode.

Referring to FIG. 2, in the high output state, a large amount of plasma is generated in the processing space S. Therefore, a large amount of electrons reaches the susceptor 12, and the Vdc is clearly generated on the surface of the wafer W. When the frequency of the frequency power is high, the profile of the distribution of the electron density is curved upward with the vertex peaked at the central region of the wafer W, as shown in FIG. 16. Hence, the profile of the distribution of Vdc in the high output state is curved downward with the vertex at the center of the wafer W.

Further, the difference between Vdc at the gate electrode disposed near the periphery of the wafer W, i.e., the portion distanced from the center of the wafer W by about 150 mm (hereinafter, referred to as "150 mm portion") and that at the gate electrode disposed near the center of the wafer W is larger than the difference between Vdc at the gate electrode disposed near the 150 mm portion and that at the gate electrode disposed near the portion distanced from the center of the wafer by about 100 mm (hereinafter, referred to as "100 mm portion") or between Vdc at the gate electrode disposed near the 150 mm portion and that at the gate electrode disposed near the portion distanced from the center of the wafer by about 50 mm (hereinafter, referred to as "50 mm portion").

In the low output state, a small amount of plasma is generated in the processing space S and a small amount of electrons reaches the susceptor 12. Accordingly, the magnitude of Vdc generated on the surface of the wafer W is small. As a consequence, the Vdc at the gate electrode disposed near the center of the wafer W, the Vdc at the gate electrode disposed near the 50 mm portion, and the Vdc at the gate electrode disposed near the 100 mm portion become substantially the same. However, as specifically seen from FIG. 2, in the low output state, the Vdc at the gate electrode disposed near the 150 mm portion is the smallest and is clearly different from those at other gate electrodes disposed near other portions of the wafer W.

Figure 3:
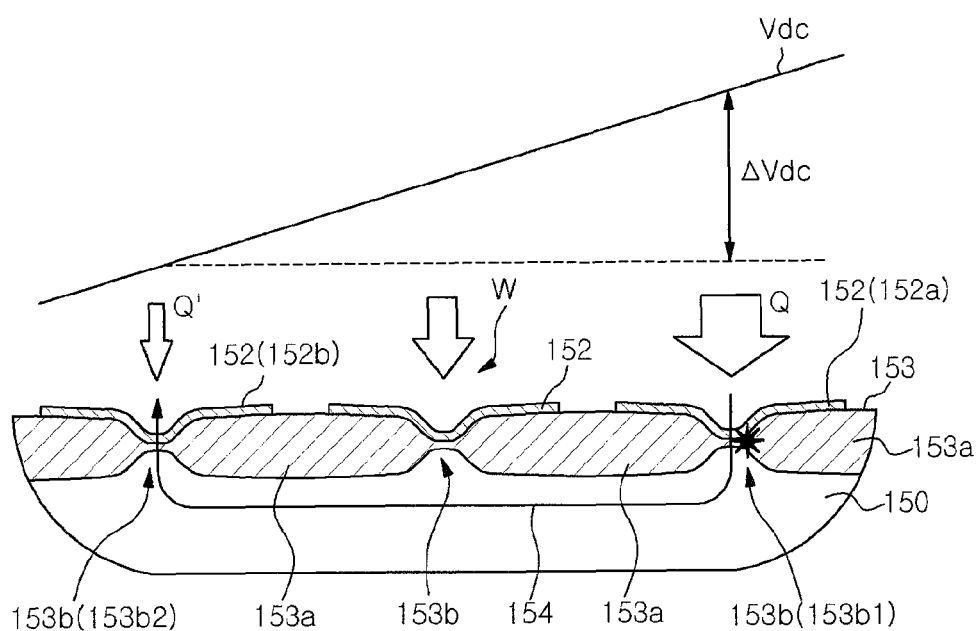
FIG. 3 explains a relationship between Vdc and destruction of a gate oxide film on the wafer.

FIG. 3 explains a relationship between the Vdc and the dielectric breakdown of the gate oxide film on the wafer.

FIG. 3 schematically shows a case in which a difference of Vdc (ΔVdc) occurs between those at two gate oxide films 153b1 and 153b2 in a wafer W in which an $SiO_2$ film 153 having a plurality of gate oxide films 153b is formed on a silicon base layer 150. The Vdc generated at a gate electrode 152a disposed near the center of the wafer W is represented with Q, and the Vdc generated at a gate electrode 152b disposed near the periphery of the wafer W is represented with Q'.

Q is larger than Q' due to the difference of Vdc between the vicinity of the center of the wafer and the vicinity of the periphery of the wafer in the non-uniform distribution of Vdc. In other words, the amounts of charges Q and Q' respectively reaching the two gate electrodes 152a and 152b from the plasma in the processing space S become different. Therefore, a potential difference occurs between the two gate electrodes, and a current 154 corresponding to the difference between Q and Q' (Q-Q') is generated between the two gate electrodes 152a and 152b. If the amount of charges passing through either the gate oxide films 153b1 or 153b2 by the current exceeds a predetermined threshold value, the gate oxide film 153b1 or 153b2 is damaged or destroyed.

Figure 4A:
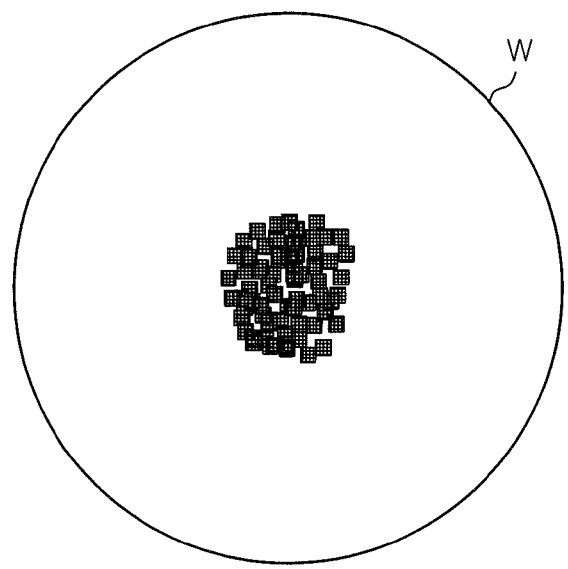
Figure 4B:
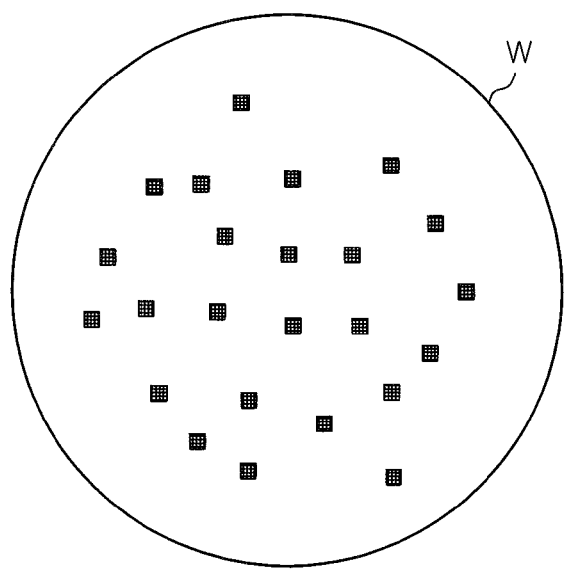

FIGS. 4A and 4B show distributions of the destroyed gate oxide films in the surface of the wafer which are obtained when the Vdcs of respective portions are different. FIG. 4A shows a high output state, and FIG. 4B shows a low output state. The destroyed gate oxide films in FIGS. 4A and 4B are indicated by 「▦」.

Referring to FIG. 4A, in the high output state, the difference between Vdc at the 150 mm portion and that at the center of the wafer W is greatest, and the current 154 flows mainly toward the gate oxide film 153b near the center of the wafer W (see FIG. 2), as described above. Therefore, the destroyed gate oxide films 153b are mainly distributed near the center of the wafer W. Referring to FIG. 4B, in the low output state, the Vdc at the center of the wafer W, the Vdc at the 50 mm portion and the Vdc at the 100 mm portion are not so different from each other. As a result, the current 154 flows in several directions on the surface of the wafer W, and the destroyed gate oxide films 153b are substantially uniformly distributed in the surface of the wafer W.

The substrate processing apparatus 10 in accordance with the present embodiment includes a plurality of electromagnets 20 that are disposed in a substantially radial shape on the top surface 13a of the upper electrode 13 which is the opposite side with respect to the processing space S in order to prevent damages or destruction of the gate oxide film 153b. Each of the electromagnets 20 has a rod-shaped yoke 20a formed of an iron core and a coil 20b wound on a side surface of the yoke 20a. The coil 20b is formed of a conducting wire and protrudes at both ends thereof. A controller (not shown) of the substrate processing apparatus 10 controls a value and a direction of the current flowing through the coil 20b of the electromagnet 20, thereby freely changing the magnetic pole of the electromagnet 20 or the entire magnetic flux or the direction of the magnetic flux generated by the electromagnet 20.

In the substrate processing apparatus 10, as shown in FIG. 1B, the electromagnets 20 are divided into a central portion facing group 21 including an electromagnet 20 facing the center of the wafer W mounted on the susceptor 12, a peripheral region facing group 22 including a plurality of electromagnets 20 facing the vicinity of the peripheral portion of the wafer W mounted on the susceptor 12 and arranged in an annular shape with respect to the center C (hereinafter, referred to as "upper electrode center C") of the upper electrode 13 facing the center of the wafer W, and an outer side facing group 23 including a plurality of electromagnets 20 arranged in an annular shape with respect to the upper electrode center C and disposed at an outer side of the peripheral region facing group 22 without facing the wafer W mounted on the susceptor 12.

In the substrate processing apparatus 10, the direction of the current flowing in the coil 20b of each electromagnet 20 in the peripheral region facing group 22 is controlled such that the processing space S side magnetic poles in the electromagnets 20 of the peripheral region facing group 22 have the same polarity, and the direction of the current flowing in the coil 20b of each electromagnet 20 in the outer side facing group 23 is controlled such that the processing space S side magnetic poles of the electromagnets 20 in the outer side facing group 23 have the same polarity.

In the present embodiment, the central portion facing group 21 includes a single electromagnet 20 in the drawing. However, it may include a plurality of electromagnets 20 disposed in an annular shape with respect to the upper electrode center C facing the center of the wafer W.

When the upper electrode 13 of the substrate processing apparatus 10 is viewed from the processing space S in the direction of the arrow in FIG. 1A, the electromagnets 20 disposed on the top surface 13a of the upper electrode 13 cannot be seen because the upper electrode 13 is not transparent. In the present embodiment, in order to explain the arrangement of the electromagnets 20, it is assumed in the drawing that the upper electrode 13 is transparent such that the arrangement of the electromagnets 20 can be seen through the upper electrode 13 by naked eyes. The same assumption is made in FIG. 5B or 8B, which is to be described later.

Figure 5A:
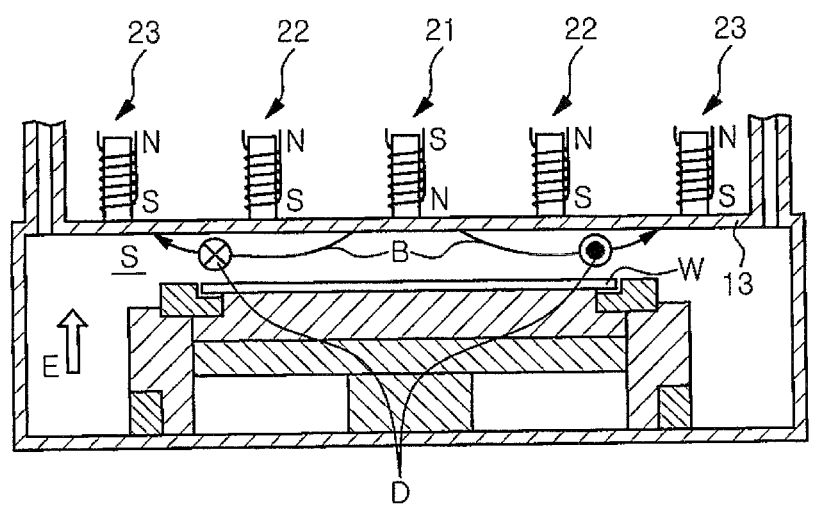
Figure 5B:
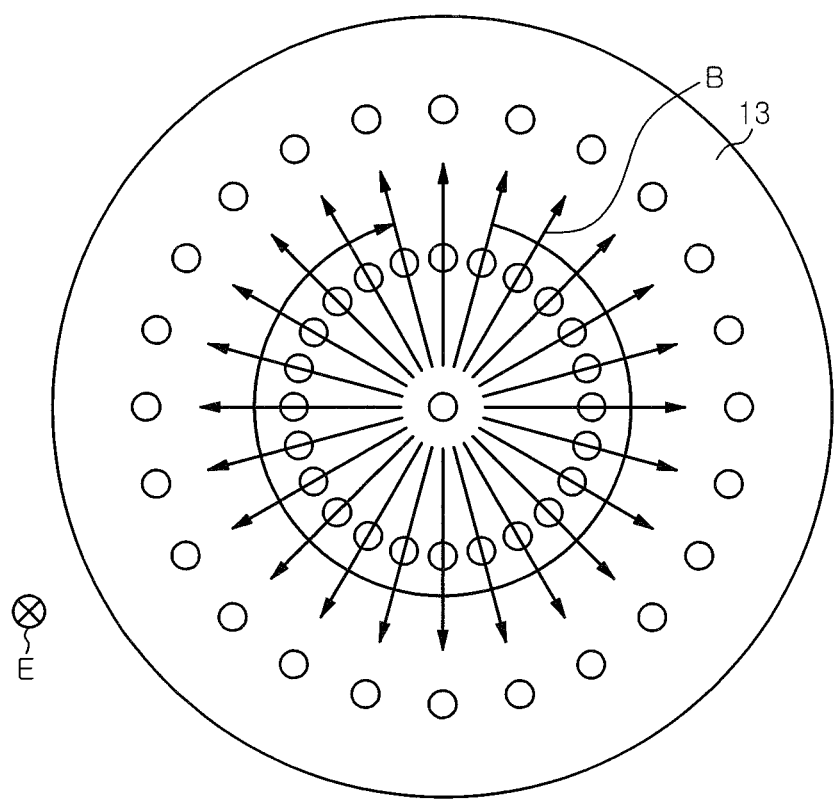

FIGS. 5A and 5B explain drift movement of electrons caused by an electric field and a magnetic field generated in the substrate processing apparatus of FIG. 1. FIG. 5A is a cross sectional view of the substrate processing apparatus of FIG. 1A, and FIG. 5B shows the upper electrode of the substrate processing apparatus viewed from below in the direction of the arrow of FIG. 5A.

In the substrate processing apparatus 10, if the processing space S side magnetic pole of the electromagnet 20 in the central portion facing group 21 is set to an N pole and the processing space S side magnetic poles of the electromagnets 20 in the peripheral region facing group 22 and the outer side facing group 23 are set to S poles, a magnetic field B is radially generated from the central portion facing group 21 toward the peripheral region facing group 22 or the outer side facing group 23, as shown in FIG. 5A, for example. At this time, as described above, since an electric field E is generated in the processing space S, electrons in the processing space S are drifted by the Lorentz force generated by the electric field E and the magnetic field B.

Specifically, the electric field E is generated from the front side to the back side in FIG. 5B, and the magnetic field B is generated in a radial shape toward the upper electrode center C. Therefore, the electrons are accelerated in a tangent direction of a circumference having the center C of the upper electrode as the center and rotated around the center C of the upper electrode along a circular electron trajectory D by the Fleming's left-hand law. At this time, the revolving electrons collide with molecules or atoms of the processing gas in the processing space S, thereby generating a plasma. As a result, an annular-shaped plasma is generated along the electron trajectory D.

The velocity $vg_E$ of the drift movement of the electrons caused by the electric field and the magnetic field is expressed by the following Eq. (1).

$$vg_E = E/B \qquad \text{Eq. (1)}$$

In accordance with Eq. (1), when the intensity of the electric field E is constant, the velocity of the drift movement of the electrons is decreased as the intensity of the magnetic field B (magnetic field intensity) is increased. When the velocity of the drift movement of the electrons is decreased, a period of time in which electrons stay at a specific location is increased and, thus, the electron density at the corresponding location is increased. As a result, the possibility in which electrons collide with molecules or atoms of the processing gas is increased, and the plasma density at the corresponding location is increased. In other words, the plasma density at the corresponding location can be increased by increasing the magnetic field intensity by the electromagnets 20 at the predetermined location.

Accordingly, the profile of the magnetic field B generated in the processing space S is changed by controlling the processing space S side magnetic poles of the electromagnets 20 in the central portion facing group 21, the peripheral region facing group 22 and the outer side facing group 23. As a consequence, the magnetic field intensity can be increased at a desired location, and thus, the plasma density at the desired location can be increased.

FIG. 6 explains a relationship between the processing space side magnetic poles of the electromagnets and an intensity of a magnetic field generated in the processing space.

FIG. 6A shows the case in which a magnetic flux does not occur because no current flows in the coil 20b of the electromagnet 20 in the central portion facing group 21; the processing space S side magnetic poles of the electromagnets in the peripheral region facing group 22 are set to S poles; and the processing space S side magnetic poles of the electromagnets 20 in the outer side facing group 23 are set to N poles.

In this case, the magnetic field B is generated from the outer side facing group 23 toward the peripheral region facing group 22, and the intensity of the magnetic field is highest between the outer side facing group 23 and the peripheral region facing group 22. Therefore, the plasma density between the outer side facing group 23 and the peripheral region facing group 22 can be increased.

FIG. 6B shows the case in which the processing space S side magnetic pole of the electromagnet 20 in the central portion facing group 21 is set to an N pole; the processing space S side magnetic poles of the electromagnets 20 in the peripheral region facing group 22 are set to S poles; and the processing space S side magnetic poles of the electromagnets 20 in the outer side facing group 23 are set to S poles.

In that case, magnetic fields B are respectively generated from the central portion facing group 21 toward the peripheral region facing group 22 and the outer side facing group 23. Since the magnetic fields B are superposed between the central portion facing group 21 and the peripheral region facing group 22, the magnetic field intensity between the central portion facing group 21 and the peripheral region facing group 22 becomes highest and, at the same time, the magnetic field intensity between the outer side facing group 23 and the peripheral region facing group 22 becomes comparatively high. Accordingly, the plasma density between the central portion facing group 21 and the peripheral region facing group 22 and that between outer side facing group 23 and the peripheral region facing group 22 can be increased. Since the plasma density is changed in accordance with the magnetic field, the plasma density between the central portion facing group 21 and the peripheral region facing group 22 is higher than that between the outer side facing group 23 and the peripheral region facing group 22.

Figure 6C:
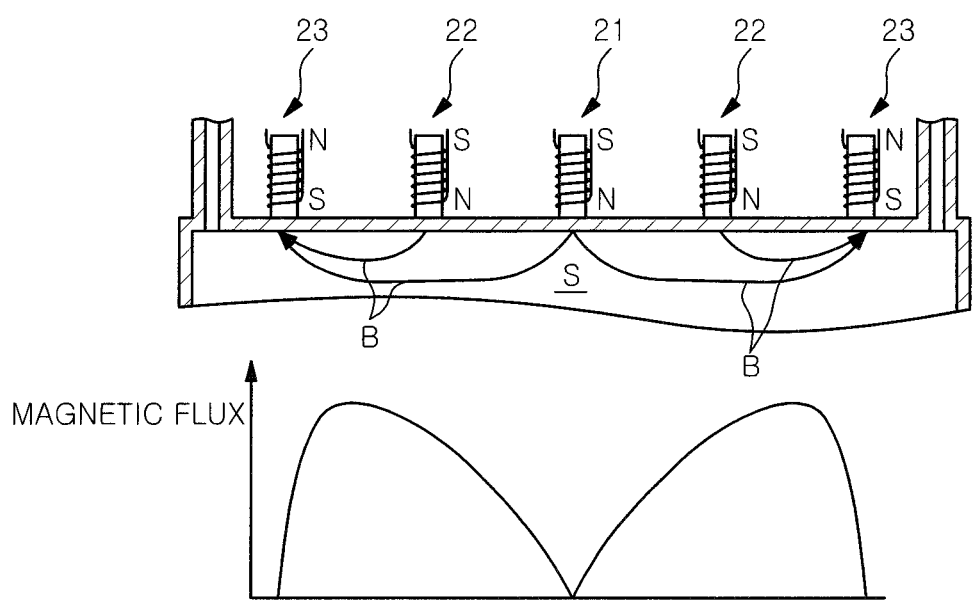

FIG. 6C shows the case in which the processing space S side magnetic pole of the electromagnet 20 in the central portion facing group 21 is set to an N pole; the processing space S side magnetic poles of the electromagnets 20 in the peripheral region facing group 22 are set to N poles; and the processing space S side magnetic poles of the electromagnets 20 in the outer side facing group 23 are set to S poles.

In this case, magnetic fields B are generated from the central portion facing group 21 and the peripheral region facing group 22 respectively toward the outer side facing group 23 and the magnetic fields B are superposed between the outer side facing group 23 and the peripheral region facing group 22. Therefore, the magnetic field intensity between the outer side facing group 23 and the peripheral region facing group 22 becomes highest and, at the same time, the magnetic field intensity between the central portion facing group 21 and the peripheral region facing group 22 becomes comparatively high. Accordingly, the plasma density between the central portion facing group 21 and the peripheral region facing group 22 and that between outer side facing group 23 and the peripheral region facing group can be increased. In this case, the plasma density between the outer side facing group 23 and the peripheral region facing group 22 is higher than that between the central portion facing group 21 and the peripheral region facing group 22.

In other words, in the substrate processing apparatus of FIG. 1A, the intensity or the distribution of the magnetic field B generated in the processing space S can be easily controlled by changing the direction or the level of the current flowing in each of the electromagnets 20.

Meanwhile, in the substrate processing apparatus 10 of FIG. 1A, the high frequency power of about 100 MHz is supplied to the susceptor 12. However, as described above, when the frequency and the level of the supplied high frequency power is high (high output state), the distribution of the electron density Ne in the plasma generated by the electric field E is curved upward with the vertex peaked at the central region. Since the distribution of Ne and that of Vdc are inversely correlated, the distribution of the Vdc is curved downward with the vertex at the vicinity of the center of the wafer W (see FIG. 7A). In other words, when the plasma is generated only by the electric field E, the distribution of Vdc on the surface of the wafer W becomes non-uniform and a difference occurs between the respective Vdcs at the gate electrodes 152a and 152b formed on the surface of the wafer W.

Figure 7A:
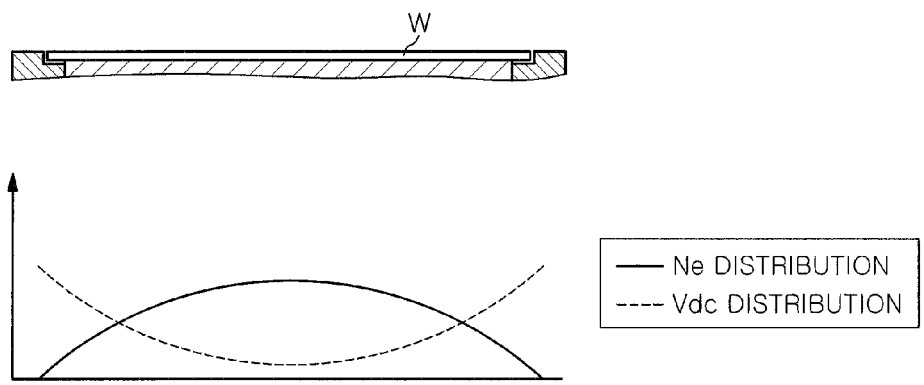

In the present embodiment, the intensity or the distribution of the magnetic field B generated in the processing space S is controlled by changing the direction or the level of the current flowing in each of the electromagnets 20. As a result, the Ne distribution in the processing space S is controlled, and Vdc on the surface of the wafer W becomes uniform. Specifically, as shown in FIG. 7A, when Ne in the plasma generated by the electric field E is curved upward with the vertex peaked at the central region, the magnetic flux density or the magnetic poles of the electromagnets 20 are controlled such that the plasma density, i.e., Ne, in the peripheral region in the processing space S is increased.

In this case, as shown in FIG. 6C, e.g., it is preferable to decrease the magnetic field intensity of the central region and to increase the magnetic field intensity of the peripheral region by setting the processing space S side magnetic pole of the electromagnet 20 in the central portion facing group 21 to an N pole, the processing space S side magnetic poles of the electromagnets 20 in the peripheral region facing group 22 to N poles, and the processing space S side magnetic poles of the electromagnets 20 in the outer side facing group 23 to S poles.

Figure 7B:
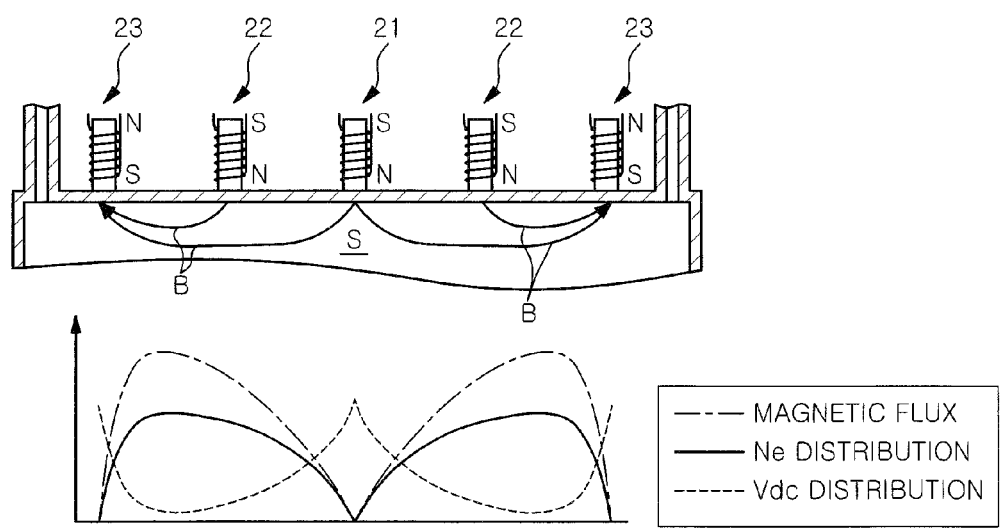
Figure 7C:
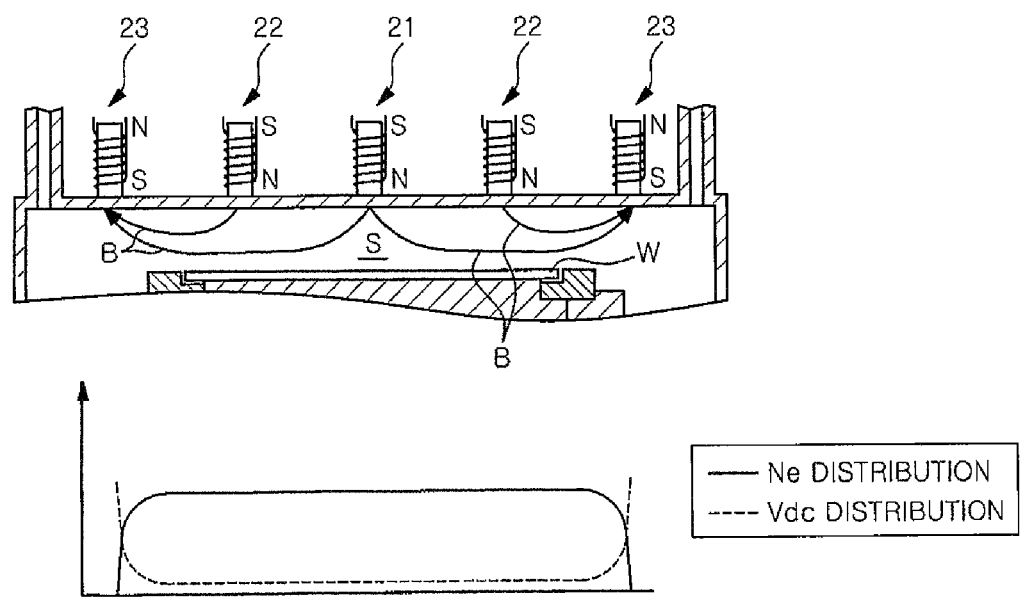

In the location where the magnetic field intensity is high, the plasma generation is facilitated. Therefore, as shown in FIG. 7B, Ne of the plasma generated by the magnetic field B can be increased in the peripheral region. As a result, the profile of the Ne distribution in the plasma generated by the electric field E (high in the central region) and the profile of the Ne distribution in the plasma generated by the magnetic field B (high in the peripheral region) are superposed, and the uniform distribution of Ne shown in FIG. 7C can be obtained. Since the distribution of Ne is uniform, the Vdc on the surface of the wafer W becomes uniform.

The profile of the Ne distribution in the plasma generated by the magnetic field B for uniforming Vdc is not limited to that shown in FIG. 6C, and may be one that compensates the portion where Ne is low in the Ne distribution in the plasma generated by the electric field E. For example, when the Ne distribution in the plasma generated by the electric field E is curved upward with the vertex peaked at the central region, the Ne distribution in the plasma generated by the magnetic filed B used for uniforming Vdc may be one described in FIG. 6A or 6B.

When Ne in the plasma generated by the electric field E is high in the peripheral region and low in the central region, it is preferable to control the direction or the level of the current flowing in the electromagnets 20 at the central portion facing group 21, the peripheral region facing group 22, and the outer side facing group 23 such that the profile of the Ne distribution in the plasma generated by the magnetic field B is low in the peripheral region and high in the central region.

When the supplied high frequency power has a high frequency and a low level (the low output state), the Vdc tends to be lowest near the periphery of the wafer W (see FIG. 2). Therefore, in that case, Vdc on the surface of the wafer W can become uniform by realizing the profile of the Ne distribution in the plasma generated by the magnetic field B such that the portion where Ne is low in the Ne distribution in the plasma generated by the electric field E is compensated.

In accordance with the substrate processing apparatus of the present embodiment, the magnetic field B is generated in the processing space S such that the Ne distribution in the processing space S becomes uniform. Since the Ne distribution in the processing space S becomes uniform, the distribution of Vdc on the surface of the wafer W can become uniform. Accordingly, the Vdcs of arbitrary two gate electrodes 152a and 152b on the wafer W become substantially the same, and the current 154 does not flow between the two gate electrodes 152a and 152b. As a result, the charge amount Q passing through the gate oxide film 153b can be reduced and, at the same time, the accumulation of charges on the gate electrode 152 can be prevented. In addition, the destruction of the gate oxide film 153b can be reliably avoided.

Further, in the substrate processing apparatus of the present embodiment, in order to make the Ne distribution uniform, the intensity of the magnetic field in the location of the processing space S where Ne is low is increased. For example, when the Ne distribution in the plasma generated by the electric field E is curved upward with the vertex peaked at the central region, the intensity of the magnetic field in the central region in the processing space S is decreased, and that in the peripheral region is increased. Therefore, the portion, where Ne is low in the Ne distribution in the plasma generated by the electric field E, can be compensated by Ne in the plasma generated by the magnetic field B. Thus, the uniform distribution of Ne can be obtained.

In the substrate processing apparatus in accordance with the present embodiment, the magnetic flux density of the magnetic field B generated by the electromagnets 20 and/or the magnetic poles of the electromagnets 20 are controlled on the electromagnet group (the central portion facing group 21, the peripheral region facing group 22 and the outer side facing group 23) basis. Therefore, the amount of Ne in the plasma whose generation is facilitated by the electromagnet groups can be controlled, and an optimal amount of Ne for compensating the portion, where Ne is low in the Ne distribution in the plasma generated by the electric field E, can be generated in the respective portions of the processing space S.

When the frequency of the high frequency power supplied to the susceptor 12 is about 60 MHz or above, the Ne distribution in the plasma generated by the electric field E is curved upward with the vertex peaked at the central region, as described above. Thus, the plasma processing method performed by the substrate processing apparatus in accordance with the present embodiment which makes the Ne distribution uniform may be preferably used when the frequency of the high frequency power supplied to the susceptor 12 is about 60 MHz or above.

The substrate processing apparatus in accordance with the present invention is not limited to the substrate processing apparatus 10 shown in FIG. 1A.

Figure 8A:
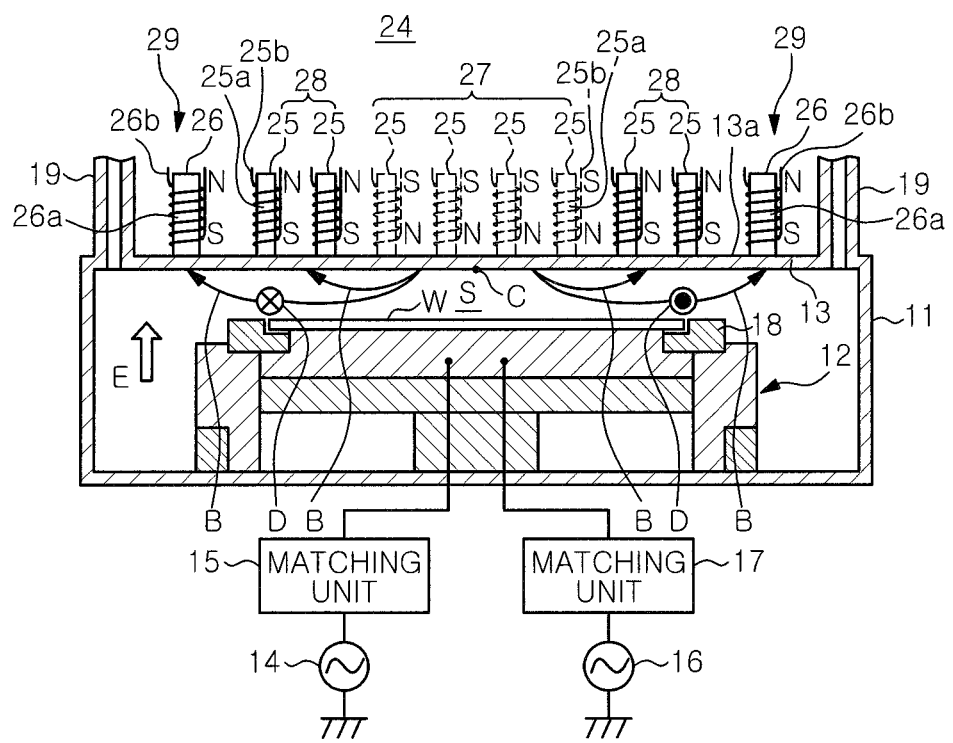
Figure 8B:
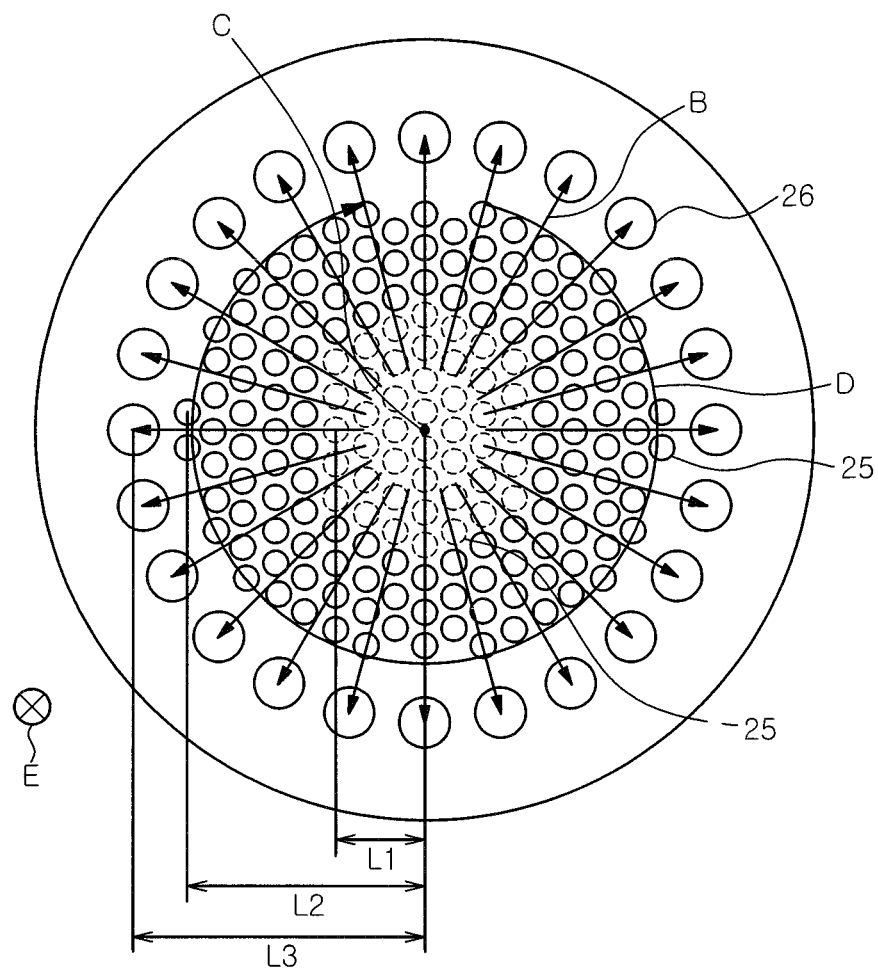

FIGS. 8A and 8B schematically show a configuration of a substrate processing apparatus in accordance with another embodiment. FIG. 8A is a cross sectional view of the substrate processing apparatus and FIG. 8B shows an upper electrode of the substrate processing apparatus viewed from below in a direction of the arrow in FIG. 8A. The configuration of the substrate processing apparatus of FIG. 8A is basically the same as that of the substrate processing apparatus 10 in FIG. 1A. Hereinafter, like reference numerals will be used for like components, and redundant description thereof will be omitted.

Referring to FIG. 8A, the substrate processing apparatus 24 includes two types of pluralities of electromagnets 25 and 26 disposed on the top surface 13a of the upper electrode 13. Each of the electromagnets 25 has a round rod-shaped yoke 25a and a coil 25b wound around the side surface of the yoke 25a. As in the case of each of the electromagnets 25, each of the electromagnets 26 also has a round rod-shaped yoke 26a and a coil 26b wound around the side surface of the yoke 26a.

In the electromagnet 25, the yoke 25a is formed of an iron core having a diameter ranging about from 6.5 mm to 7.5 mm, and the coil 25b is formed of a copper wire that is wound about 180 to 200 times around the side surface of the yoke 25a. In the electromagnet 26, the yoke 26a is formed of an iron core having a diameter ranging about from 26 mm to 28 mm, and the coil 26b is formed of a copper wire wound about 1300 to 1500 times around the side surface of the yoke 26a.

In the electromagnets 25 and 26, the entire magnetic flux generated by the electromagnets 25 and 26 or the magnetic poles of the electromagnets 25 and 26 can be controlled by controlling the values and the directions of the currents flowing in the coils 25b and 26b.

Generally, the entire magnetic flux generated by the electromagnets is expressed by the following Eq. (2).

$$\text{Entire magnetic flux} = \text{magnetomotive force} / \text{magnetic resistance} \qquad \text{Eq. (2)}$$

The entire magnetic flux indicates the amount of all magnetic force lines generated from one ends of the yokes that are iron cores, and the unit thereof is Wb (weber). The magnetomotive force indicates a force for generating magnetic flux in a so-called magnetic circuit, and the unit thereof is AT (ampere turn). Specifically, the magnetomotive force is expressed by a product of the number of coil windings on a yoke and a value of the current flowing in the coil. Therefore, as the coil winding number and the value of the current flowing in the coil are both increased, the magnetomotive force is also increased. The magnetic resistance is an index indicating the difficulty of the magnetic flux flow in the magnetic circuit, which is expressed by the following Eq. (3).

magnetic resistance=length of magnetic path/(permeability×cross sectional area of magnetic path)     Eq. (3)

The length of the magnetic path is the length of a yoke; the permeability is a permeability of the yoke; and the cross sectional area of the magnetic path is a cross sectional area of the yoke. Hence, as the length of the yoke gets longer and the diameter of the yoke gets smaller, the magnetic resistance becomes greater.

In the electromagnets 25 and 26, the yokes 25a and 26a have the same length and the same permeability. The values of the currents flowing in the coils 25b and 26b are substantially the same (current flows in the coil 25b at a peak of about 0.78 A and current flows in the coil 26b at a peak of about 0.70 A). Since, however, the winding number of the coil 26b is larger than that of the coil 25b, the magnetomotive force of the electromagnet 26 is larger than that of the electromagnet 25. Further, the diameters of the yokes 26 are larger than those of the yokes 25, so that the magnetic resistance of the electromagnet 26 becomes smaller than that of the electromagnet 25. Accordingly, the entire magnetic flux generated by the electromagnets 26 becomes larger than that generated by the electromagnets 25. Specifically, the entire magnetic flux generated by the electromagnets 26 becomes about 8 to 12 times larger than that generated by the electromagnets 25.

In the substrate processing apparatus 24, as shown in FIG. 8B, the electromagnets 25 and 26 are divided into a central portion facing group 27 including a plurality of electromagnets 25 facing the central portion of the wafer W; a peripheral region facing group 28 including a plurality of electromagnets 25 disposed around the central portion facing group 27 to face the peripheral portion of the wafer W; and an outer side facing group 29 including a plurality of electromagnets 26 disposed in an annular shape about the center C of the upper electrode and at an outer side of the peripheral region facing group 28 without facing the wafer W.

Here, when the electromagnets 25 face the central portion or the peripheral portion of the wafer W, the electromagnets 25 are disposed at the location facing the central portion or the peripheral portion of the wafer W on the upper electrode 13. When the electromagnets 26 do not face the wafer W, the electromagnets 26 are disposed at the location facing the outer side of the wafer W on the upper electrode 13. In the central portion facing group 27 and the peripheral portion facing group 28, the electromagnets 25 are radially arranged at a regular interval.

The central portion facing group 27 includes a plurality of electromagnets 25 whose centers are spaced from the upper electrode center C by a distance of about 74.4 mm or less (indicated by $L_1$ in FIG. 8B); the peripheral portion facing group 28 includes a plurality of electromagnets 25 whose centers are spaced from the upper electrode center C by a distance larger than about 74.4 mm and smaller than about 148.8 mm (indicated by $L_2$ in FIG. 8B); and the outer side facing group 29 includes a plurality of electromagnets 26 whose centers are spaced from the upper electrode center C by a distance of about 190 mm (indicated by $L_3$ in FIG. 8B). In FIGS. 8A and 8B, the electromagnets 25 of the central portion facing group 27 are indicated by dashed lines.

In each of the central portion facing group 27 and the peripheral portion facing group 28, the directions of the currents flowing in the coils 25b of the electromagnets 25 are set such that the processing space S side magnetic poles of the electromagnets 25 have the same polarity. In the outer side facing group 29, the directions of the currents flowing in the coils 26b of the electromagnets 26 are set such that the processing space S side magnetic poles of the electromagnets 26 have the same polarity.

In the substrate processing apparatus 24, when the Ne distribution in the plasma generated by the electric field E is curved upward with a vertex peaked at the central region, e.g., the processing space S side magnetic poles of the electromagnets 25 in the central portion facing group 27 are set to N poles, and the processing space S side magnetic poles of the electromagnets 25 in the peripheral portion facing group 28 and the processing space S side magnetic poles of the electromagnets 26 in the outer side facing group 29 are set to S poles. In this case, as shown in FIGS. 8A and 8B, the magnetic field B is radially generated from the central portion facing group 27 toward the peripheral portion facing group 28 or the outer side facing group 29.

In the magnetic fields B thus generated, the entire magnetic flux generated by the electromagnets 26 of the outer side facing group 29 is larger than that generated by the electromagnets 25 in the central portion facing group 27 or the peripheral portion facing group 28, as described above. Therefore, in the magnetic fields B, the magnetic field intensity of the peripheral region is larger than that of the central region, and the magnetic field intensity near the outer side facing group 29, i.e., the peripheral region, is maximized. The Ne distribution in the plasma generated by the magnetic fields B is high in the peripheral region. As a result, by superposing the profile of the Ne distribution in the plasma generated by the electric field E (high in the central region) and the profile of the Ne distribution of in the plasma generated by the magnetic field B (high in the peripheral region), the uniform distribution of Ne can be obtained, and the Vdc on the surface of the wafer W becomes uniform.

The Ne distribution in the plasma generated by the magnetic fields B for making the Vdc uniform is not limited to those shown in FIGS. 8A and 8B, and the distribution that compensates the portion where Ne is low in the Ne distribution in the plasma generated by the electric field E may be applied, as the case of the substrate processing apparatus 10 in FIG. 1A. Further, in the substrate processing apparatus 24, a method for changing the position of the magnetic flux of the magnetic field B in the processing space S by changing the boundary position between the central portion facing group 27 and the peripheral region facing group 28 by controlling the currents flowing in the coils 25b of the electromagnets 25 may be used for controlling the Ne distribution in the plasma generated by the magnetic field B. Accordingly, the Ne distribution in the plasma generated by the magnetic field B can be further freely controlled. As a result, the profile of the Ne distribution in the plasma generated by the electric field E which can be compensated is further varied.

By controlling the currents flowing in the coils 25b of the electromagnets 25, the electromagnets 25 may be divided into a single electromagnet group or three or more electromagnet groups. Particularly, when the electromagnets 25 are divided into three or more electromagnet groups, the Ne distribution in the plasma generated by the magnetic field B in the processing space S can be controlled in a further detailed manner. Therefore, the profile of the Ne distribution in the plasma generated by the electric field E which can be compensated is further varied.

Hereinafter, a plasma processing method performed by the substrate processing apparatus in accordance with a second embodiment of the present invention will be described.

As in the case of the plasma processing method of the first embodiment, the plasma processing method in accordance with the present embodiment is performed by the substrate processing apparatus 10 in FIG. 1 or the substrate processing apparatus 24 in FIG. 8. In the plasma processing method of the present embodiment, unlike the plasma processing method of the first embodiment, the high frequency power is supplied from the first high frequency power supply 14 to the susceptor 12 in a pulse form, and the plasma generation state and the plasma non-generation state are alternately repeated in the processing space S.

FIGS. 9A and 9B show waveforms of a high frequency power supplied to a susceptor in a plasma processing method performed by the substrate processing apparatus in accordance with the present embodiment. FIG. 9A shows a waveform of a high frequency power that is supplied not in a pulse form, and FIG. 9B shows a waveform of a high frequency power that is supplied in a pulse form.

In the present embodiment as well, for example, in the substrate processing apparatus 10, the profile of the Ne distribution in the plasma generated by the magnetic field B is realized such that the portion where Ne is low in the Ne distribution in the plasma generated by the electric field E is compensated by controlling the magnetic flux density of the magnetic field B generated by the electromagnets 20 and/or the magnetic poles of the electromagnets 20. Since, however, it is general that when the level of the high frequency power supplied to the susceptor 12 is high (high output state), a large amount of plasma is generated by the electric field E. Hence, the magnitude of a difference between high and low points in the Ne distribution is increased, and the portion where Ne is low in the Ne distribution in the plasma generated by the electric field E may not be completely compensated only by Ne in the plasma generated by the magnetic field B.

In this case, the Vdc is not completely uniform on the surface of the wafer W, so that a difference of Vdc occurs between arbitrary two gate electrodes 152a and 152b on the wafer W. Therefore, the current 154 flowing between the two gate electrodes 152a and 152b is generated and charges are accumulated on the gate electrode 152 by the current 154.

In the substrate processing apparatus of the present embodiment, as shown in FIG. 9B, there are prepared a plasma generation period (first period) in which the high frequency power supplied to the susceptor 12 is controlled such that a plasma is generated by the electric field E in the processing space S and a plasma non-generation period (second period) in which the high frequency power supplied to the susceptor 12 is controlled, e.g., in which the high frequency power is not supplied, such that a plasma is not generated by the electric field E in the processing space S. Further, the duty ratio of the plasma generation period is set to, e.g., about 50%, and the plasma generation period and the plasma non-generation period are repeated at a predetermined frequency, e.g., about 90 kHz.

Accordingly, even if charges are accumulated on the gate electrode 152 in an arbitrary location of the wafer W by the current 154 during the plasma generation period, the current 154 does not flow during the plasma non-generation period. Therefore, the accumulated charges are distributed to the SiO$_2$ film 153 or the like in the periphery thereof, and the problem of accumulation of the charges on the gate electrode 152 is solved. As a result, the increase in accumulated charges on the gate electrode 152 can be prevented, and thus, the destruction of the gate oxide film 153b can be reliably suppressed.

In the substrate processing apparatus in accordance with the present embodiment, the etching rate may be slightly decreased because the plasma non-generation period is provided during the plasma processing. Thus, the plasma non-generation period is preferably performed when the portion where Ne is low in the Ne distribution in the plasma generated by the electric field E cannot be completely compensated only by Ne in the plasma generated by the magnetic field B. In view of the etching rate, it is preferable to increase the plasma generation period. When the magnitude of the difference between the high and low points in the Ne distribution after generating Ne in the plasma by the magnetic field B is small, it is preferable to set the duty ratio of the plasma generation period to, e.g., about 50% or above. Further, in the embodiment of the present invention, the duty ratio can be set within the range of about 10% to 90%, and the pulse frequency corresponding to the frequency of repeating the plasma generation period and the plasma non-generation period can be set within the range from about 1 Hz to 1 MHz.

Although the present invention has been described by using the above embodiments, the present invention is not limited to the above embodiments.

Test Examples

Hereinafter, test examples of the present invention will be described.

Figure 10:
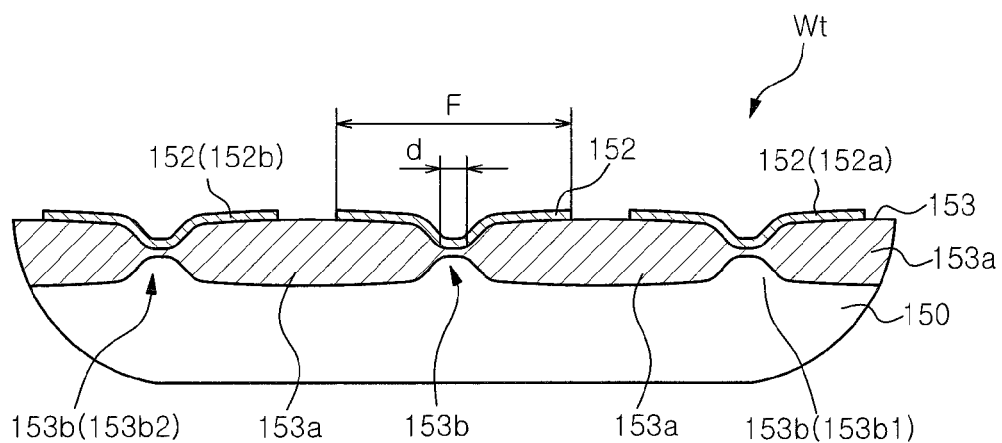
FIG. 10 is a cross sectional view schematically showing a configuration of a first test wafer.

First, a plurality of first test wafers Wt in which an oxide film (SiO$_2$ film) 153 having gate oxide films 153b1 and 153b2 was formed on a silicon base layer 150 and a plurality of gate electrodes 152a and 152b was formed on the oxide film 153 (see FIG. 10) was prepared. Further, two types of first test wafers Wt having different ratios of an area F of the gate electrode 152 to an area d of the gate oxide film 153b (hereinafter, referred to as "antenna ratio") were prepared, and the antenna ratios were set to about 1 M (million) and about 100 K (hundred thousand).

Then, the first test wafers Wt were subjected to plasma processing by the substrate processing apparatus 24 under different conditions, and the yields of the gate oxide films 153b of the first test wafers Wt were measured.

Herein, a low output of high frequency power applied in dry etching in the present comparative example and test examples is relatively lower than a high output of high frequency power applied in dry etching which will be later described by referring to FIGS. 13A to 13F.

First, a high frequency power of about 100 MHz was consecutively supplied from the first high frequency power supply 14 to the susceptor 12 at a low output of about 400 W, i.e., at a duty ratio of about 100%. Further, O$_2$ single gas was introduced as a processing gas into the processing space S without supplying a high frequency power of about 3.2 MHz from the second high frequency power supply 16 to the susceptor 12. A magnetic field B was not generated in the processing space S, and a wafer Wt having an antenna ratio of about 1 M was subjected to dry etching for about 10 seconds (comparative example 1).

Figure 11A:
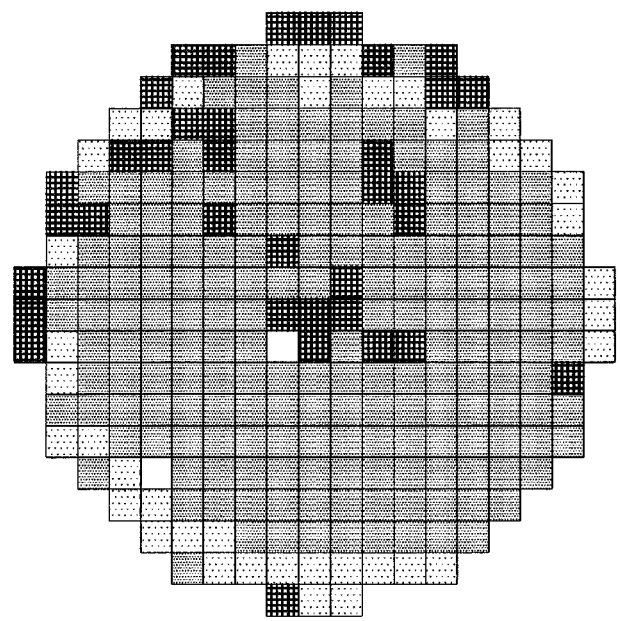

FIG. 11A shows a yield of the gate oxide film 153b after performing dry etching in the comparative example 1. Locations where the gate oxide films 153b were destroyed are indicated by a dark square. The darker square indicates that a larger amount of the gate oxide film 153b was destroyed in the corresponding region. In the comparative example 1, the gate oxide film 153b was destroyed on the entire surface, and the yield of the gate oxide film 153b was about 16%.

Then, in the central portion facing group 27, the processing space S side magnetic poles of the electromagnets 25 were set to N poles and the magnetomotive force of each electromagnet 25 was set to about 150 AT. In the peripheral region facing group 28, the processing space S side magnetic poles of the electromagnets 25 were set to S poles and the magnetomotive force of each electromagnet 25 was set to about −25 AT. In the outer side facing group 29, the processing space S side magnetic poles of the electromagnets 25 were set to S poles and the magnetomotive force of each electromagnet 26 was set to about −250 AT.

The first test wafer Wt having an antenna ratio of about 1 M was subjected to dry etching for about 10 seconds under the same conditions as those of the comparative example 1 except that the magnetic field B for compensating the portion where Ne was low in the Ne distribution in the plasma generated by the electric field E was generated in the processing space S (test example 1).

Figure 11B:
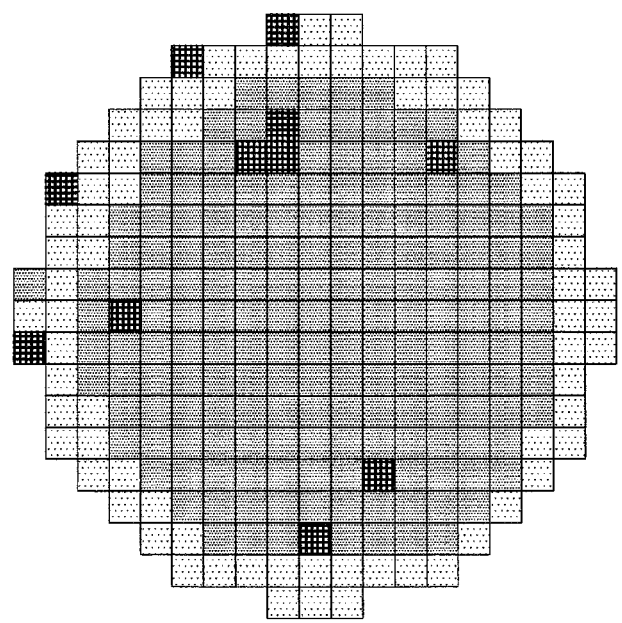

FIG. 11B shows a yield of the gate oxide film 153b after performing the dry etching in the test example 1. In the test example 1, although the destructions of the gate oxide films 153b were monitored on the entire surface, and the yield of the gate oxide film 153b was improved to about 30%.

Next, in the central portion facing group 27, the processing space S side magnetic poles of the electromagnets 25 were set to N poles, and the magnetomotive force of each electromagnet 25 was set to about 25 AT. In the peripheral region facing group 28, the processing space S side magnetic poles of the electromagnets 25 were set to S poles, and the magnetomotive force of each electromagnet 25 was set to about −25 AT. In the outer side facing group 29, the processing space S side magnetic poles of the electromagnets 25 were set to S poles, and the magnetomotive force of each electromagnet 25 was set to about −400 AT. The magnetic field B for compensating the portion where Ne was low in the Ne distribution in the plasma generated by the electric field E was generated in the processing space S, and the first test wafer Wt having an antenna ratio of about 1 M was subjected to dry etching for about 10 seconds under the same conditions as those of the comparative example 1 except that the high frequency power of about 100 MHz was supplied from the first high frequency power supply 14 to the susceptor 12 at a low output of about 800 W in a pulse form having a duty ratio of about 50% (test example 2).

Figure 11C:
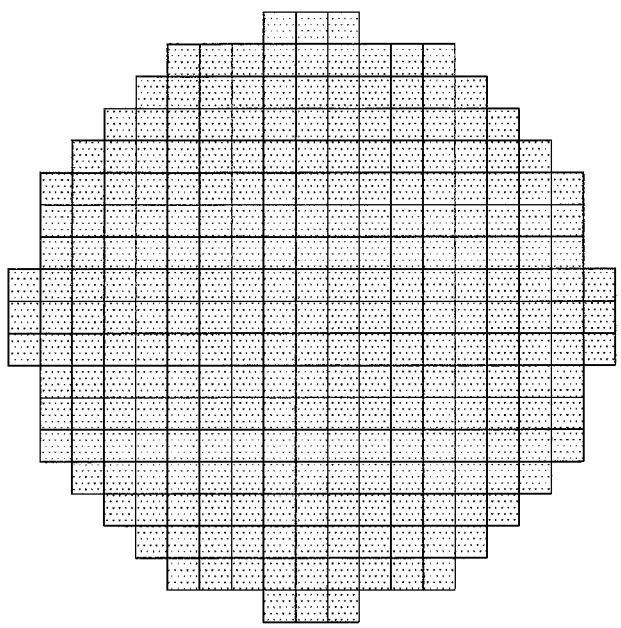

FIG. 11C shows a yield of the gate oxide film 153b after performing the dry etching in the test example 2. In the test example 2, no gate oxide film 153b was destroyed, and the yield of the gate oxide film 153b was improved to about 100%.

Next, the first test wafer Wt having an antenna ratio of about 100 K was subjected to dry etching for about 10 seconds under the same conditions as those of the comparative example 1 (comparative example 2).

Figure 11D:
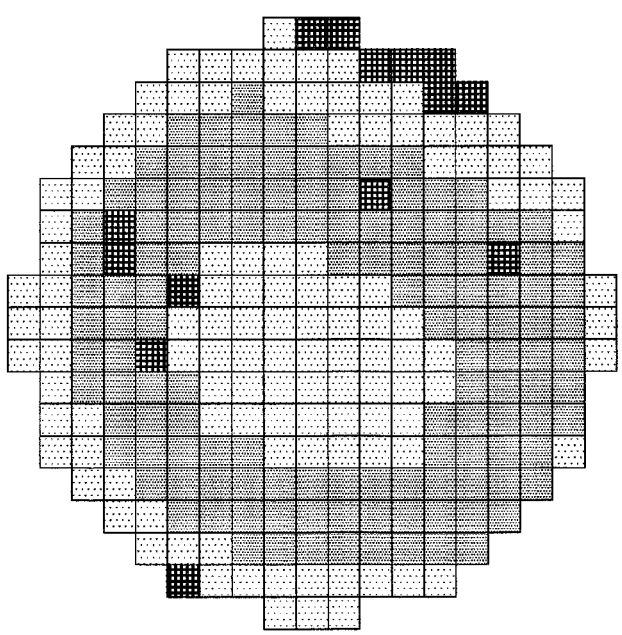

FIG. 11D shows a yield of the gate oxide film 153b after the dry etching in the comparative example 2. As in the comparative example 1, the gate oxide films 153b of the comparative example 2 were destroyed on the entire surface, and the yield of the gate oxide film 153b was about 45%.

Next, the first test wafer Wt having an antenna ratio of about 100 K was subjected to dry etching for about 10 seconds under the same conditions as those of the test example 1 (test example 3).

Figure 11E:
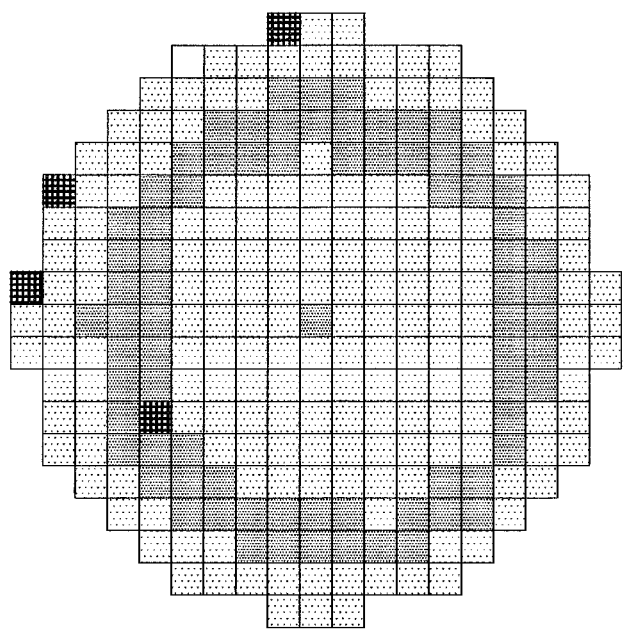

FIG. 11E shows a yield of the gate oxide film 153b after performing the dry etching in the test example 3. At this time, the yield of the gate oxide film 153b was improved to about 67%.

Next, the first test wafer Wt having an antenna ratio of about 100 K was subjected to dry etching for about 10 seconds under the same conditions as those of the test example 2 (test example 4).

Figure 11F:
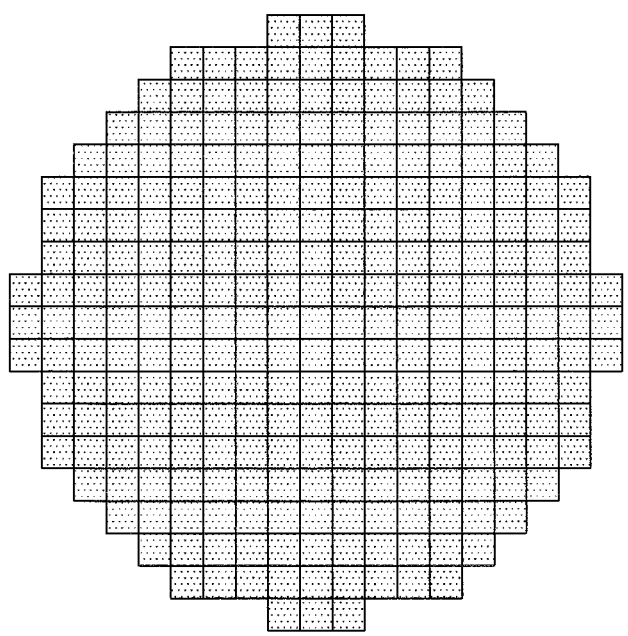

FIG. 11F shows a yield of the gate oxide film 153b after performing the dry etching in the test example 4. In the test example 4, no gate oxide film 153b was destroyed, and the yield of the gate oxide film 153b was improved to about 100%.

From the comparison between the comparative example 1 and the test example 1, it has been seen that the yield of the gate oxide film 153b was improved. From the comparison between the comparative example 2 and the test example 3, it has been seen that the yield of the gate oxide film 153b was also improved. Therefore, it is clear that the deviation of Vdc on the surface of the wafer W is improved and the generation of the current 154 flowing between the gate electrodes 152 is suppressed by generating in the processing space S the magnetic field B for compensating the portion where Ne is low in the Ne distribution in the plasma generated by the electric field E in the low output state.

From the comparison between the test examples 1 and 2, it has been found out that the yield of the gate oxide film 153b was improved. From the comparison between the test examples 3 and 4, it has been found out that the yield of the gate oxide film 153b was also improved. Therefore, it can be deduced that the charges accumulated on the gate electrode 152 were distributed to the $SiO_2$ film 153 or the like in the periphery thereof during the plasma non-generation period, whereby the amount of charges accumulated on the gate electrode 152 was reduced. This has been achieved by providing the plasma non-generation period at a predetermined interval by supplying a high frequency power in a pulse form from the first high frequency power supply 14 in the low output state.

Further, the second test wafers having photoresists on the entire surfaces thereof were prepared and subjected to dry etching under the same conditions as those of the comparative example 1 and under the same conditions as those of the test examples 1 and 2. Then, the etching rates of the photoresists in the second test wafers were measured.

Figure 12A:
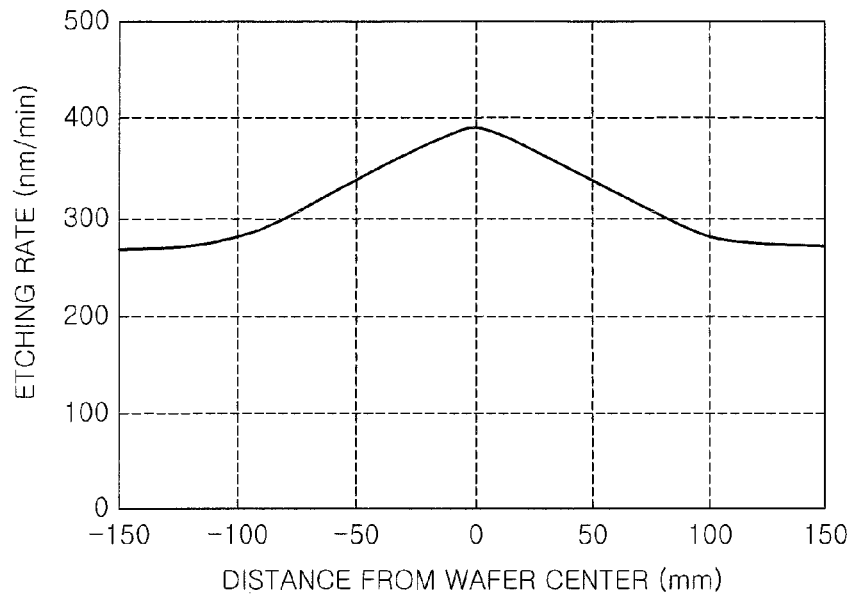
Figure 12B:
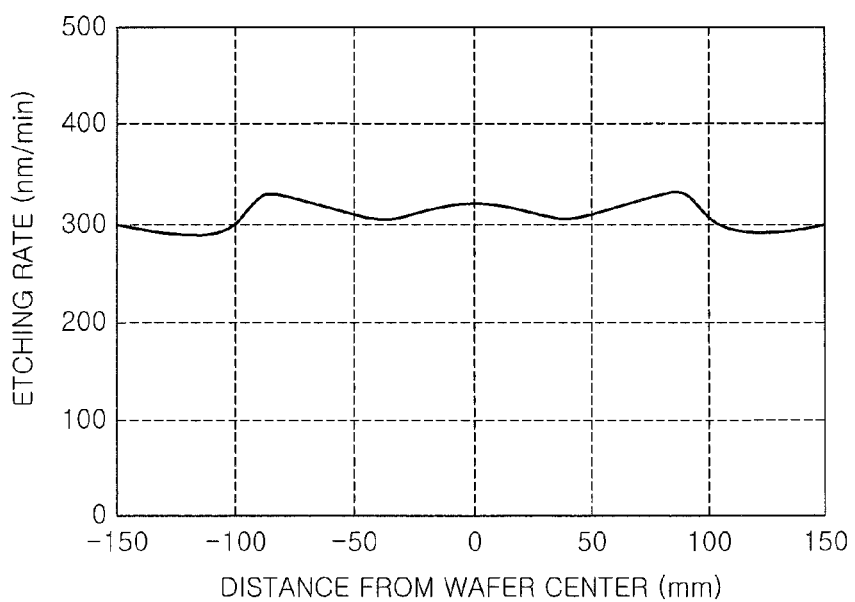
Figure 12C:
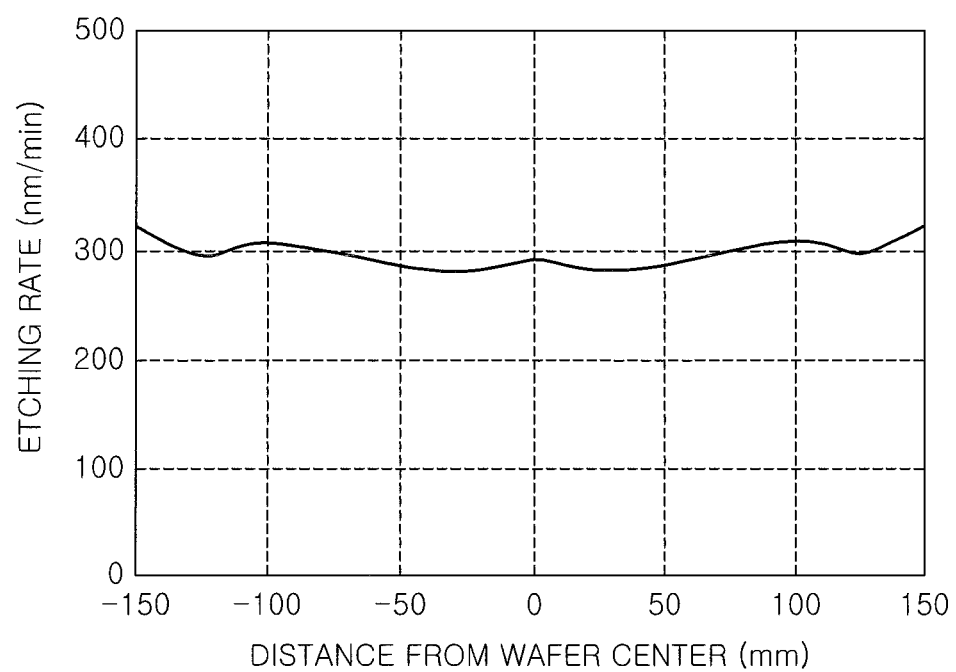

When the dry etching was performed under the same conditions as those of the comparative example 1 (see FIG. 12A), the etching rate in the surface of the second test wafer Wt was non-uniform and the etching rate at the center of the wafer was high. However, when the dry etching was performed under the same conditions as those of the test example 1 (see FIG. 12B) or when the dry etching was performed under the same conditions as those of the test example 2 (see FIG. 12C), the non-uniformity of the etching rate in the surface of the second test wafer Wt was improved. The profile of the distribution of the etching rate reflects the profile of the distribution of the plasma on the second test wafer. From the comparisons among FIGS. 12A, 12B and 12C, in the low output state, the distribution of the plasma on the second test wafer Wt was improved, i.e., the deviation of Vdc on the surface of the second test wafer Wt was improved, by generating in the processing space S a magnetic field B for compensating the portion where Ne was low in the Ne distribution in the plasma generated by the electric field E.

Next, the dry etching was performed on the first test wafer Wt having an antenna ratio of about 1 M for about 10 seconds under the same conditions as those of the comparative example 1 except that the high frequency power of about 100 MHz was consecutively supplied from the first high frequency power supply 14 to the susceptor 12 at a high output of about 1200 W (comparative example 3).

Figure 13A:
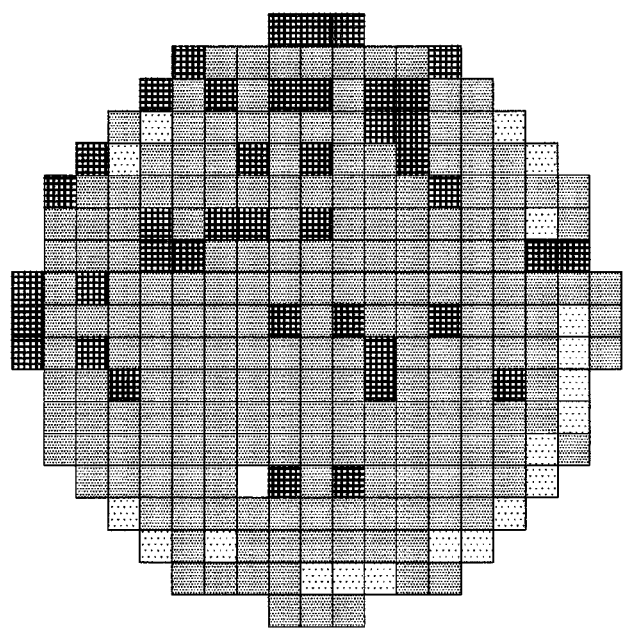

FIG. 13A shows a yield of the gate oxide film 153b after performing the dry etching in the comparative example 3. In the comparative example 3, the yield of the gate oxide film 153b was about 8%.

Then, the dry etching was performed on the first test wafer Wt having an antenna ratio of about 1 M for about 10 seconds under the same conditions as those of the test example 1 except that the high frequency power of about 100 MHz was consecutively supplied from the first high frequency power supply 14 to the susceptor 12 at a high output of about 1200 W (test example 5).

Figure 13B:
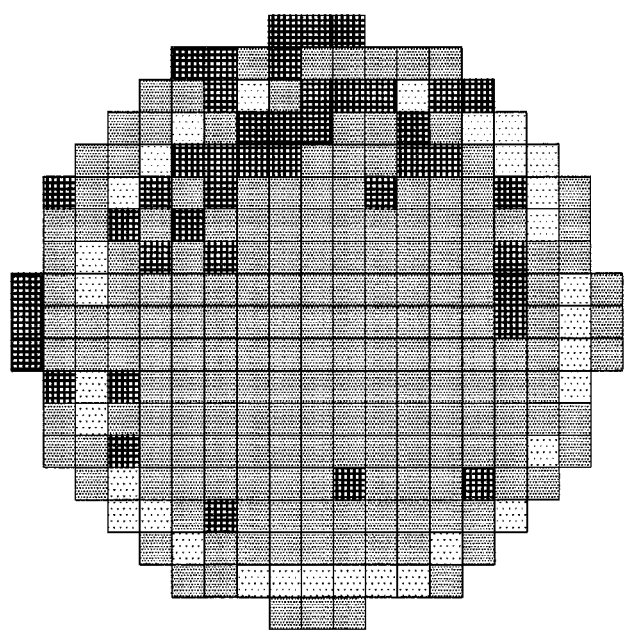

FIG. 13B shows a yield of the gate oxide film 153b after performing the dry etching in the test example 5. In the test example 5, the yield of the gate oxide film 153b was improved to about 12%.

Thereafter, the high frequency power of about 100 MHz was supplied from the first high frequency power supply 14 to the susceptor 12 at a high output of about 2400 W in a pulse form having a duty ratio of about 50%, the other conditions were set to be same as those of the test example 5 and the dry etching was performed on the first test wafer Wt having an antenna ratio of about 1 M for about 10 seconds (test example 6).

Figure 13C:
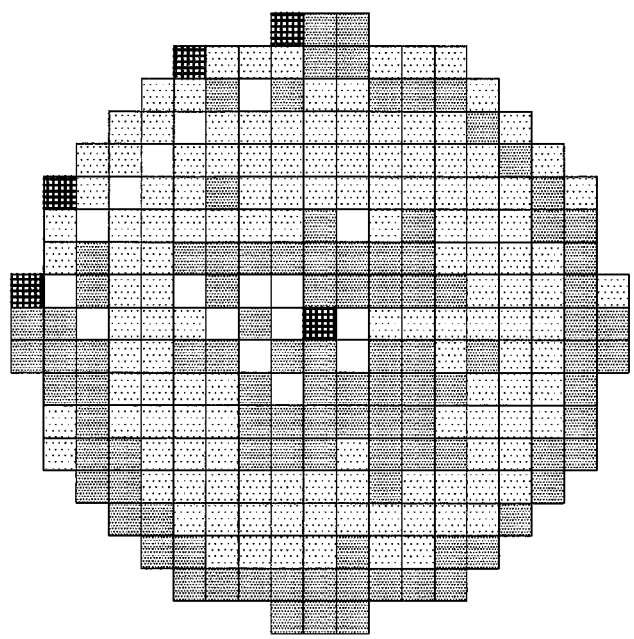

FIG. 13C shows a yield of the gate oxide film 153b after performing the dry etching in the test example 6. In the test example 6, the yield of the gate oxide film 153b was improved to about 54%.

Next, the dry etching was performed for about 10 seconds on the first test wafer Wt having an antenna ratio of about 100 K under the same conditions as those of the comparative example 3 (comparative example 4).

Figure 13D:
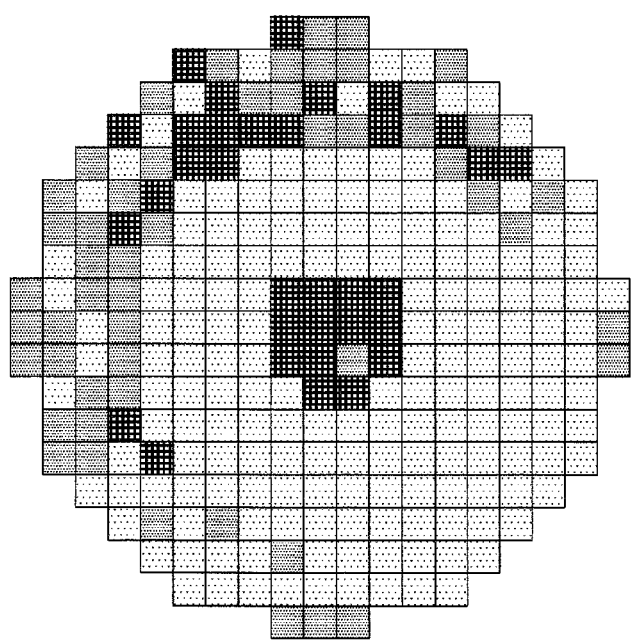

FIG. 13D shows a yield of the gate oxide film 153b after performing the dry etching in the comparative example 4. In the comparative example 4, the destructions of the gate oxide films 153b mainly occurred at the center of the first test wafer Wt, and the yield of the gate oxide film 153b was about 67%.

Thereafter, the dry etching was performed on the first test wafer Wt having an antenna ratio of about 100 K for about 10 seconds under the same conditions as those of the test example 5 (test example 7).

Figure 13E:
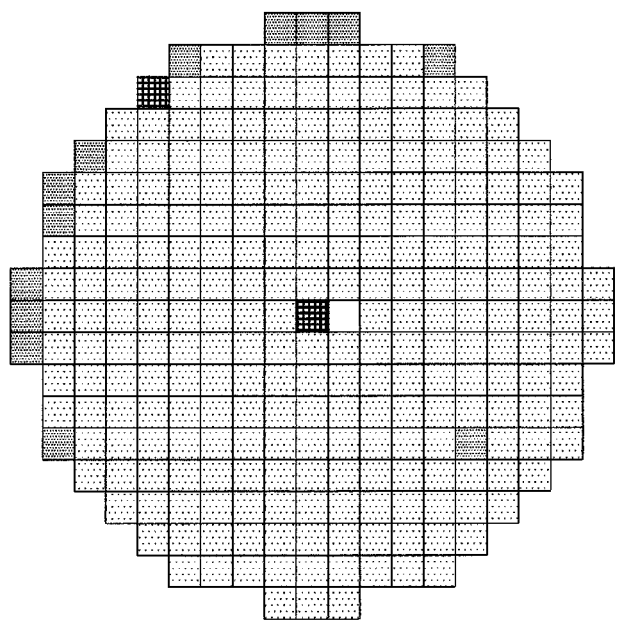

FIG. 13E shows a yield of the gate oxide film 153b after performing the dry etching in the test example 7. In the test example 7, the yield of the gate oxide film 153b was improved to about 94%.

Next, the dry etching was performed on the first test wafer Wt having an antenna ratio of about 100 K for about 10 seconds under the same conditions as those of the test example 6 (test example 8).

Figure 13F:
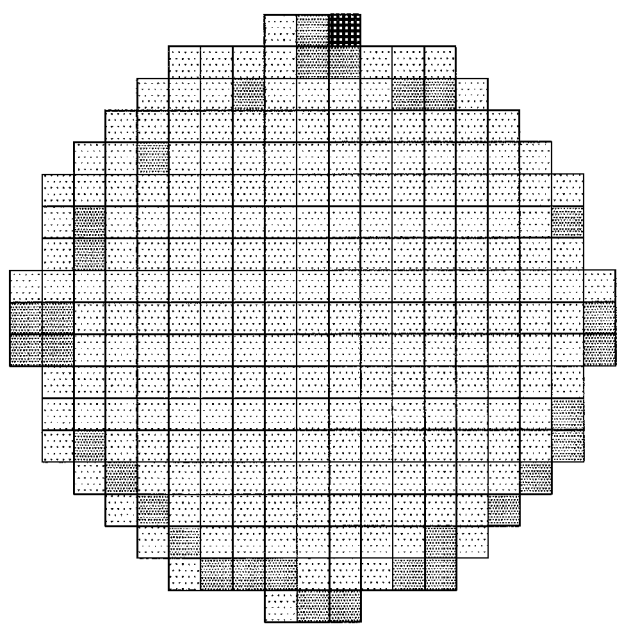

FIG. 13F shows a yield of the gate oxide film 153b after performing the dry etching in the test example 8. In the test example 8, the yield of the gate oxide film 153b was improved to about 87%.

From the comparison between the comparative example 3 and the test example 5, it is found that the yield of the gate oxide film 153b was improved. From the comparison between the comparative example 4 and the test example 7, it is found that the yield of the gate oxide film 153b was also improved. Thus, even in the high output state, the deviation of Vdc on the surface of the wafer W was improved and the generation of the current 154 flowing between the gate electrodes 152 was suppressed by generating in the processing space S the magnetic field B for compensating the portion where Ne was low in the Ne distribution in the plasma generated by the electric field E.

From the comparison between the test examples 5 and 6, it is found that the yield of the gate oxide film 153b was improved. Therefore, even in the high output state, the charges accumulated on the gate electrode 152 were distributed to the $SiO_2$ film 153 or the like in the periphery thereof during the plasma non-generation period, whereby the amount of charges accumulated on the gate electrode 152 was reduced. This has been achieved by providing the plasma non-generation period at a predetermined interval by supplying a high frequency power in a pulse form from the first high frequency power supply 14. From the comparison between the test examples 7 and 8, it is found that the yield of the gate oxide film 153b was not improved. However, this is considered because a plasma was excessively generated due to the high frequency power supplied at the high output and this resulted in an increase in the amount of charges accumulated on the gate electrodes 152a and 152b and incomplete distribution of the charges accumulated during the plasma non-generation period.

Further, the second test wafers having photoresists on the entire surfaces thereof were prepared and subjected to dry etching under the same conditions as those of the comparative example 3 and under the same conditions as those of the test examples 5 and 6. Then, the etching rates of the photoresists in the second test wafers were measured.

Figure 14A:
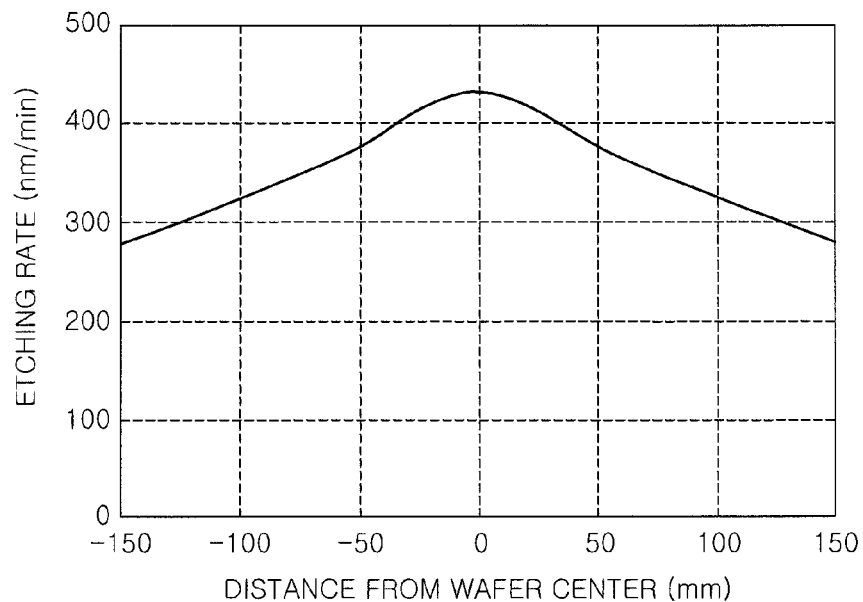
Figure 14B:
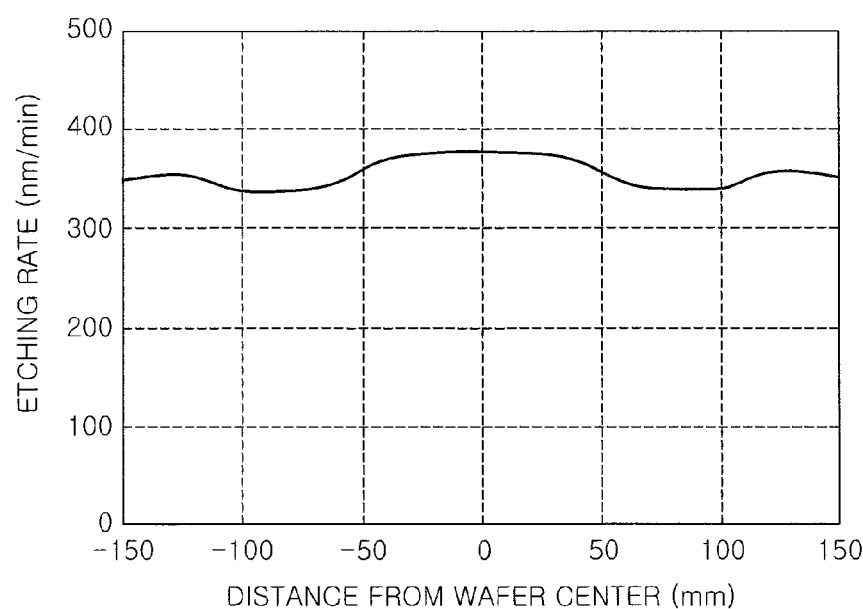
Figure 14C:
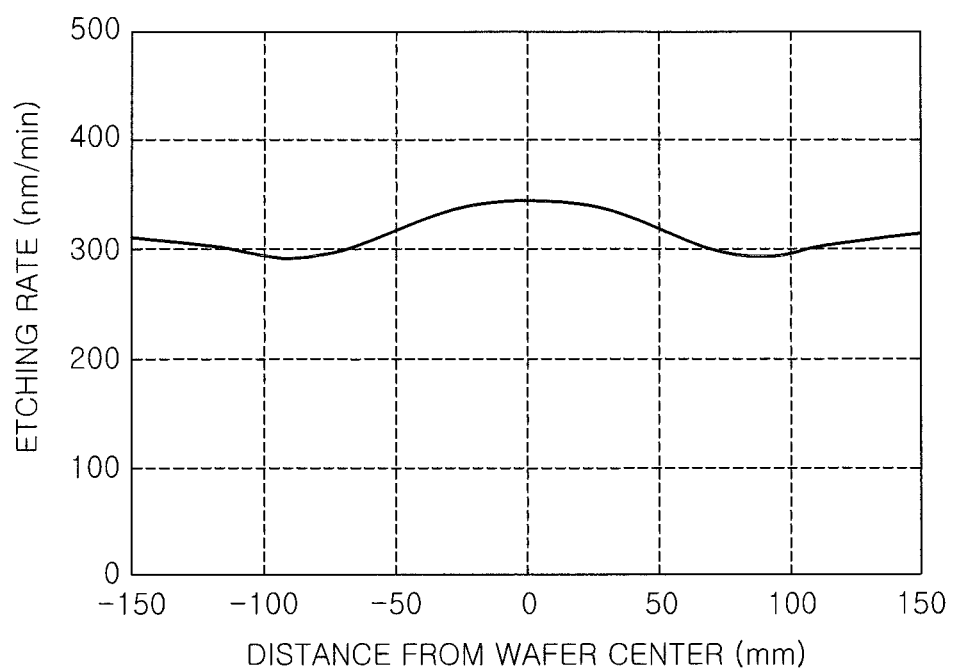
Figure 15:
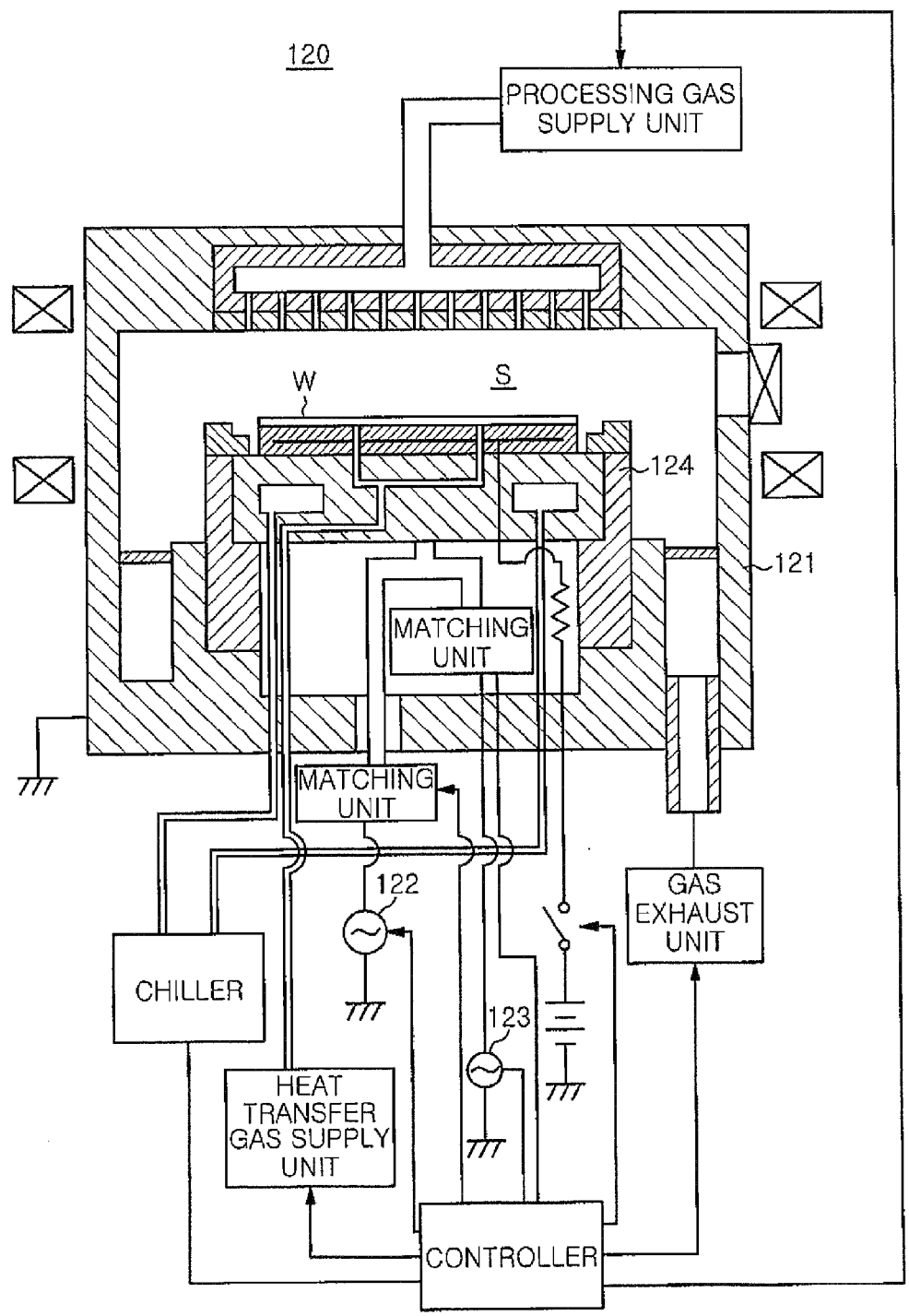
FIG. 15 is a cross sectional view schematically showing a configuration of a conventional substrate processing apparatus.

In the case of performing dry etching under the same conditions as those of the comparative example 3 (see FIG. 14A), the etching rate in the surface of the second test wafer Wt was non-uniform and the etching rate at the center of the wafer was high. However, in the case of performing dry etching under the same conditions as those of the test example 5 (see FIG. 14B) or in the case of performing dry etching under the same conditions as those of the test example 6 (see FIG. 14C), it is confirmed that the non-uniformity of the etching rate in the surface of the second test wafer Wt was improved. From the comparison among FIGS. 14A, 14B and 14C, it has been observed that even in the high output state, the distribution of the plasma on the second test wafer Wt was improved, i.e., the deviation of Vdc on the surface of the second test wafer Wt was improved, by generating in the processing space S a magnetic field B for compensating the portion where Ne was low in the Ne distribution in the plasma generated by the electric field E.

While the invention has been shown and described with respect to the embodiments, it will be understood by those skilled in the art that various changes and modification may be made without departing from the scope of the invention as defined in the following claims. Such modifications are considered to be within the scope of this invention.

What is claimed is:

1. A substrate processing apparatus configured to generate an electric field in a processing space between a lower electrode, to which a high frequency power is supplied, and an upper electrode facing the lower electrode and perform plasma processing on a substrate mounted on the lower electrode by using a plasma generated by the electric field, the apparatus comprising:
    a plurality of electromagnets disposed on a surface of the upper electrode, each of the electromagnets having a rod-shaped yoke comprising an iron core and a coil wound on a side surface of the yoke, and
    a controller configured to control a level and a direction of a current flowing through the coil of each of the electromagnets, wherein the electromagnets consist of:
(i) a central portion group including at least one electromagnet arranged at a center portion of the upper electrode, said at least one electromagnet of the central portion group each including a processing space side magnetic pole facing toward the processing space,
(ii) a peripheral region group including multiple electromagnets arranged in an annular shape with respect to the center portion of the upper electrode and disposed at an outer side of the central portion group, the electromagnets of the peripheral region group each including a processing space side magnetic pole facing toward the processing space, and
(iii) an outer side group including plural electromagnets arranged in an annular shape with respect to the center portion of the upper electrode and disposed at an outer side of the peripheral region group, the electromagnets of the outer side group each including a processing space side magnetic pole facing toward the processing space,
wherein the peripheral region group is disposed radially inside of an outer periphery of the substrate mounted on the lower electrode and the outer side group is disposed radially outside of the outer periphery of the substrate mounted on the lower electrode,
wherein the yokes of the plurality of electromagnets have a same length and a same permeability,
wherein each yoke of the electromagnets of the outer side group has a lager winding number and a larger diameter than each yoke of said at least one electromagnet of the central portion group and the electromagnets of the peripheral region group, and
wherein a polarity of the processing side space magnetic pole of the central portion group is the same as a polarity of the processing space side magnetic poles of the peripheral region group, and the polarity of the processing space side magnetic poles of the peripheral region group is different from a polarity of the processing space side magnetic poles of the outer side group.

2. The substrate processing apparatus of claim 1, wherein a frequency of the high frequency power supplied to the lower electrode is about 60 MHz or above.

3. The substrate processing apparatus of claim 1, wherein each of said at least one electromagnet of the central portion group includes an opposite pole facing away from the processing space,
wherein the electromagnets of the peripheral region group each include an opposite pole facing away from the processing space,
wherein the controller is configured to control a direction of a current flowing through a coil of each electromagnet included in the peripheral region group such that the processing space side magnetic poles of the electromagnets included in the peripheral region group have a same polarity,
wherein the electromagnets of the outer side group each include an opposite pole facing away from the processing space, and
wherein the controller is configured to control a direction of a current flowing through a coil of each electromagnet included in the outer side group such that the processing space side magnetic poles of the electromagnets included in the outer side group have a same polarity wherein the controller is configured to control the polarity of the processing space side magnetic pole of the central portion group to be the same as the polarity of the processing space side magnetic poles of the peripheral region group, and
wherein the controller is configured to control the polarity of the processing space side magnetic poles of the peripheral region group to be different from the polarity of the processing space side magnetic poles of the outer side group.

4. The substrate processing apparatus of claim 1, wherein the controller is configured to control a distribution of a plasma density in the processing space by repeating a first and a second period for the high frequency power supplied to the lower electrode,
wherein the high frequency power supplied during the first period is configured so that the electric field is plasma generating; and
wherein the high frequency power supplied during the second period is configured so that the electric field is not plasma generating.

5. The substrate processing apparatus of claim 4, wherein a ratio of the first period to a sum of the first and the second period ranges from about 10% to about 90%, and
a frequency represented by a multiplicative inverse of the sum of the first and the second period ranges from about 1 Hz to about 1 MHz.

6. The substrate processing apparatus of claim 1, wherein the controller is configured to simultaneously change the direction of the current flowing through the coil of each of the plurality of electromagnets.

7. The substrate processing apparatus according to claim 1, wherein the electromagnets of the peripheral region group each include an opposite pole facing away from the processing space, and wherein the electromagnets of the outer side group each include an opposite pole facing away from the processing space, and
wherein the controller is configured to simultaneously change a polarity of the processing space side magnetic poles of the central region group, peripheral region group, and the outer side group.

8. The substrate processing apparatus of claim 1, wherein the controller is configured to simultaneously reverse a polarity of electromagnets of the central portion group, the peripheral region group, and the outer side group.

9. The substrate processing apparatus of claim 1, wherein a distance between a center of the upper electrode and each center of said at least one electromagnet included in the central portion group is equal to or smaller than 74 mm,
wherein a distance between the center of the upper electrode and each center of the electromagnets included in the peripheral region group is greater than 75 mm and smaller than 148 mm, and
wherein a distance between the center of the upper electrode and each center of the electromagnets included in the outer side group is about 190 mm.

10. The substrate processing apparatus of claim 1, wherein the yoke of each electromagnet in the central portion group, the peripheral region group, and the outer side group are oriented in a same direction.

* * * * *